United States Patent
Himeno et al.

(10) Patent No.: US 8,445,883 B2
(45) Date of Patent: May 21, 2013

(54) NONVOLATILE SEMICONDUCTOR MEMORY DEVICE AND MANUFACTURING METHOD THEREOF

(75) Inventors: Atsushi Himeno, Osaka (JP); Takumi Mikawa, Shiga (JP); Yoshio Kawashima, Osaka (JP)

(73) Assignee: Panasonic Corporation, Osaka (JP)

( * ) Notice: Subject to any disclaimer, the term of this patent is extended or adjusted under 35 U.S.C. 154(b) by 215 days.

(21) Appl. No.: 13/126,975

(22) PCT Filed: Jul. 16, 2009

(86) PCT No.: PCT/JP2009/003354
§ 371 (c)(1),
(2), (4) Date: Apr. 29, 2011

(87) PCT Pub. No.: WO2010/050094
PCT Pub. Date: May 6, 2010

(65) Prior Publication Data
US 2011/0220861 A1   Sep. 15, 2011

(30) Foreign Application Priority Data
Oct. 30, 2008   (JP) .................................. 2008-279416

(51) Int. Cl.
*H01L 29/02* (2006.01)

(52) U.S. Cl.
USPC ..... 257/2; 257/3; 257/4; 257/5; 257/E29.002; 438/678; 438/102; 438/103; 438/104

(58) Field of Classification Search
USPC .... 257/2–5, E29.002; 438/102–104; 365/163
See application file for complete search history.

(56) References Cited

U.S. PATENT DOCUMENTS

| 6,753,561 B1 | 6/2004 | Rinerson et al. |
| 7,282,387 B2 | 10/2007 | Klein |

(Continued)

FOREIGN PATENT DOCUMENTS

| JP | 10-335588 | 12/1998 |
| JP | 11-261027 A | 9/1999 |

(Continued)

OTHER PUBLICATIONS

International Search Report issued in International Patent Application No. PCT/JP2009/003354, mailed Oct. 20, 2009.

(Continued)

*Primary Examiner* — Jami M Valentine
(74) *Attorney, Agent, or Firm* — McDermott Will & Emery LLP

(57) ABSTRACT

A nonvolatile semiconductor memory device which can achieve miniaturization and a larger capacity in a cross-point structure in which memory cells are formed inside contact holes at cross points of word lines and bit lines, respectively, and a manufacturing method thereof are provided. A nonvolatile semiconductor memory device comprises a substrate; a plurality of stripe-shaped lower copper wires (70) formed on the substrate; an interlayer insulating layer (76) formed on the substrate provided with the lower copper wires (70), a plurality of contact holes penetrating interlayer insulating layer (76) to surfaces of the lower copper wires (70), respectively; electrode seed layers (77) and precious metal electrode layers (78) formed only at bottoms of the contact holes, respectively; resistance variable layers (73) filled into the contact holes such that the resistance variable layers are connected to the precious metal electrode layers (73), respectively; a plurality of stripe-shaped upper copper wires (74) connected to the resistance variable layers (73), respectively, and cross the lower copper wires (70), respectively, and the electrode seed layers (77) and the precious metal electrode layers (78) are formed by selective growth plating.

12 Claims, 19 Drawing Sheets

U.S. PATENT DOCUMENTS

| | | |
|---|---|---|
| 2003/0047764 A1 | 3/2003 | Joo |
| 2003/0052330 A1* | 3/2003 | Klein .......................... 257/154 |
| 2004/0142498 A1 | 7/2004 | Joo |
| 2006/0098472 A1 | 5/2006 | Ahn et al. |
| 2006/0203541 A1 | 9/2006 | Toda |
| 2007/0285969 A1 | 12/2007 | Toda et al. |
| 2007/0285970 A1 | 12/2007 | Toda et al. |
| 2007/0285971 A1 | 12/2007 | Toda et al. |
| 2008/0121865 A1 | 5/2008 | Ahn et al. |
| 2008/0185572 A1 | 8/2008 | Chiang et al. |
| 2008/0185573 A1 | 8/2008 | Sun et al. |
| 2009/0052225 A1 | 2/2009 | Morimoto |

FOREIGN PATENT DOCUMENTS

| | | |
|---|---|---|
| JP | 2005-256128 | 9/2005 |
| JP | 2008-235427 A | 10/2008 |
| WO | WO 2008/047711 A1 | 4/2008 |
| WO | WO 2008/117371 A1 | 10/2008 |
| WO | WO 2008/126166 A1 | 10/2008 |

OTHER PUBLICATIONS

International Preliminary Report on Patentability issued in International Patent Application No. PCT/JP2009/003354, mailed Dec. 7, 2010.

* cited by examiner (a)

(b)

(a)

(b)

(c)

(a)

(b)

(a)

(b)

(a)

(b)

(a)

(b)

(a)

(b)

(c)

(a)

(b)

(a)

(b)

(a)

(b)

(a)

(b)

NONVOLATILE SEMICONDUCTOR MEMORY DEVICE AND MANUFACTURING METHOD THEREOF

RELATED APPLICATIONS

This application is the U.S. National Phase under 35 U.S.C. §371 of International Application No. PCT/JP2009/003354, filed on Jul. 16, 2009, which in turn claims the benefit of Japanese Application No. 2008-279416, filed on Oct. 30, 2008, the disclosures of which Applications are incorporated by reference herein.

TECHNICAL FIELD

The present invention relates to a cross-point nonvolatile semiconductor memory device including a resistance variable layer. Particularly, the present invention relates to a nonvolatile semiconductor memory device having a structure suitable for a miniaturized configuration, and a manufacturing method thereof.

BACKGROUND ART

With recent progresses of a digital technology in electronic equipment, larger-capacity and nonvolatile semiconductor memory devices have been developed vigorously to store data of music, image, information, and so on. For example, a nonvolatile semiconductor memory device using ferroelectric as a capacitive element is already known in many fields. In addition to the nonvolatile semiconductor memory device using such a ferroelectric capacitor, attention has been focused on a nonvolatile semiconductor memory device (hereinafter referred to as ReRAM) using a material which changes its resistance values by application of electric pulses and retain the changed states, because it is highly compatible with a standard semiconductor process.

As a resistance variable layer, nickel oxide layer (NiO), vanadium oxide layer ($V_2O_5$), zinc oxide layer (ZnO), niobium oxide layer ($Nb_2O_5$), titanium oxide layer ($T_iO_2$), tungsten oxide layer ($WO_3$), cobalt oxide layer (CoO), etc., are used. It is known that such a transition metal oxide layer exhibits specific resistance values when voltages or currents which are not less than thresholds are applied thereto and retain the specific resistance values until new voltages or currents are applied thereto. The transition metal oxide layer has a feature that it can be manufactured using the existing DRAM process steps without modifying it.

Patent literature 1 discloses a configuration of a cross-point ReRAM in which, a memory plug is formed at a cross-point of a X-direction conductive array line and a Y-direction conductive array line. This memory plug is composed of a resistance variable memory element and a diode element having a metal-insulator-metal (MIM) structure. The memory plug comprises seven layers stacked together. A composite metal oxide sandwiched between two electrode layers is a memory element, and the MIM diode element is formed on the memory element.

Patent literature 2 discloses a ReRAM including a substrate provided with two or more bit lines arranged to be spaced apart from each other and in parallel with each other, two or more word lines arranged to be spaced apart from each other and in parallel with each other and crossing the bit lines, respectively, resistive structures formed at cross-points of the bit lines and the word lines and above the bit lines, respectively, and diode structures formed on the resistive structures in contact with the resistive structures and the word lines, respectively, lower electrodes formed on the substrate, resistive structures formed on the lower electrodes, respectively, diode structures formed on the resistive structures, respectively, and upper electrodes formed on the diode structures, respectively.

Patent literature 3 discloses a cross-point ReRAM including a resistance variable element composed of a lower electrode, a variable resistor, and an upper electrode between a bit line and a word line, and a non-linear element connected in series with the resistance variable element.

CITATION LISTS

Patent Literature

Patent literature 1: U.S. Pat. No. 6,753,561 specification
Patent literature 2: Japanese Laid-Open Patent Application Publication No. 2006-140489
Patent literature 3: Japanese Laid-Open Patent Application Publication No. 2006-203098

SUMMARY OF THE INVENTION

Technical Problem

In the memory cell structures disclosed in patent literature 1, patent literature 2, and patent literature 3, or similar memory cell structures, since the resistance variable memory element and the diode element are formed at a cross-point of the bit line and the word line, a stacked-layer structure of at least three layers is required. In a possible manufacturing method, for example, as shown in FIG. 19(a), after stacking all layers of a resistance variable element 7 composed of a lower electrode 2, a resistance variable layer 3 and an intermediate electrode 4, and a metal-semiconductor-metal (MSM) diode element 8 composed of the intermediate electrode 4, a semiconductor layer 5 and an upper electrode 6, these layers are processed into a pillar shape using lithography and dry etching, as shown in FIG. 19(b).

In this method, if a design rule is changed to be adaptive to a miniaturized configuration without changing a layer thickness of the resistance variable element and a layer thickness of the diode element, the memory cell must be processed into a pillar shape with a high aspect ratio. In a dry etching for forming the pillar shape with a high aspect ratio, problems such as inadequate etching, side etching, or plasma charge damage occurs. Besides, wear-out of a mask material used in etching is problematic and a pillar tends to have a tapered shape. If a thickness of the mask is increased, durability of the mask can be improved, but precision of a miniaturized pattern is decreased. Therefore, it is difficult to implement a larger-capacity nonvolatile semiconductor memory device using the method of forming the pillar structure with the high aspect ratio by dry etching, which is not suitable for a miniaturized configuration. Furthermore, it is difficult to form by dry etching, a miniaturized pattern using materials, for example, copper (Cu) with a low steam pressure, or precious metal with a low reactivity and a low steam pressure, such as platinum (Pt) or iridium (Ir).

In a case where the resistance variable element 7 and the diode element 8 are formed into a contact hole in a structure in which layers are filled into a hole, which is suitable for a miniaturized configuration, it is necessary to form an electrode layer and a semiconductor layer inside the contact hole. However, in conventional sputtering or CVD, it is difficult to deposit a metal thin layer, a semiconductor thin layer, and other layers in a planarized shape inside the contact hole. In other words, in the conventional sputtering or CVD, as shown in FIG. 19(c), a layer is without fail deposited on a side wall of the contact hole and on an interlayer insulating layer outside the contact hole. Therefore, it is difficult to stack the metal thin layer and the semiconductor thin layer in a planarized shape inside the contact hole, in practice.

In addition to the above, after depositing the layer, as shown in FIG. 19(d), it is necessary to remove and planarize the metal thin layer outside the contact hole by CMP or etch back. However, in a case where a precious metal, which is low in reactivity and is oxidized less easily, is used as an electrode material, it is very difficult to conduct CMP using a general oxidizer and a metal polishing solution containing solid polishing abrasive grains or the like. Moreover, even if the precious metal can be polished physically, the interlayer insulating layer is more likely to be damaged by scratches generated by a mechanical polishing action of fine particles contained in the polishing solution. This would result in a low yield.

When the resistance variable element and the diode element are filled into the contact hole by removing the electrode material or the like on the interlayer insulating layer by CMP or the like, a memory cell structure shown in FIG. 19(e) is always formed in the deposition method using sputtering or CVD, and a current leak occurs between the bit line 1 at lower side and the word line 9 at upper side, which are connected to the memory cell, via the layer (e.g., lower electrode 2 in FIG. 19(e)) deposited on the side wall of the contact hole as described above.

The present invention is directed to solving the above described problem associated with the prior art, and an object of the present invention is to provide a nonvolatile semiconductor memory device which includes a cross-point ReRAM using precious metal such as Pt as an electrode material, can suppress a current leak between a word line and a bit line, and can achieve a miniaturized configuration and a larger-capacity, and a manufacturing method thereof.

Solution to Problem

To achieve the above object, a method of manufacturing a nonvolatile semiconductor memory device of the present invention, comprises a step (A) of forming a plurality of stripe-shaped lower copper wires on a substrate; a step (B) of forming an interlayer insulating layer on the substrate provided with the lower copper wires such that a plurality of contact holes are provided in the interlayer insulating layer in locations above the lower copper wires, respectively, and forming precious metal electrode layers comprising precious metal on the lower copper wires, respectively, by selective growth plating such that the precious metal electrode layers are located in bottom regions of the contact holes, respectively; a step (C) of filling resistance variable layers into the contact holes such that the resistance variable layers are connected to the precious metal electrode layers, respectively; and a step (D) of forming a plurality of stripe-shaped upper copper wires on the interlayer insulating layer and the resistance variable layers such that the upper copper wires are connected to the resistance variable layers, respectively, and cross the lower copper wires, respectively.

In such a method, since a planarized precious metal electrode layer can be formed into the contact hole, without depositing the precious metal electrode layer on a side wall of the contact hole or on the interlayer insulating layer outside the contact hole, it is possible to suppress a current leak between the upper copper wire (word line or bit line) and the lower copper wire (bit line or word line). In addition, since the resistance variable layer is filled into the contact hole, it is possible to achieve a miniaturized configuration and a larger capacity in the nonvolatile semiconductor memory device.

The phrase "forming precious metal electrode layers comprising precious metal on the lower copper wires, respectively, by selective growth plating such that the precious metal electrode layers are located in bottom regions of the contact holes, respectively" is meant to include forming the precious metal electrode layers such that they are located only at bottoms of the contact holes, respectively, and forming the precious metal electrode layers such that they are located in regions including the bottoms of the contact holes, respectively.

The method of manufacturing the nonvolatile semiconductor memory device, according to one aspect of the present invention, comprises a step (A) of forming the plurality of stripe-shaped lower copper wires on the substrate; a step (B1) of forming stripe-shaped precious metal electrode layers comprising precious metal by selective growth plating such that the precious metal electrode layers are stacked on the lower copper wires, respectively; a step (B2) of forming an interlayer insulating layer over the substrate provided with the lower copper wires and the precious metal electrode layers; a step (B3) of forming a plurality of contact holes in the interlayer insulating layer such that the contact holes penetrate the interlayer insulating layer to surfaces of the precious metal electrode layers, respectively; a step (C) of filling the resistance variable layers into the contact holes such that the resistance variable layers are connected to the precious metal electrode layers, respectively; and a step (D) of forming the plurality of stripe-shaped upper copper wires on the interlayer insulating layer and the resistance variable layers such that the upper copper wires are connected to the resistance variable layers, respectively, and cross the lower copper wires, respectively.

In such a method, since the precious metal electrode layer can be formed only on the lower copper wire by selective growth plating, processing of the precious metal by lithography or dry etching may be omitted. Because of this, ReRAM using the precious metal can achieve a miniaturized configuration, which was not implemented easily by etching. As a result, it is possible to manufacture a larger-capacity nonvolatile semiconductor memory device. In addition, the plating process is compatible with a wire forming step using copper damascene. Furthermore, since the precious metal electrode layer is not deposited on the side wall of the contact hole or on the interlayer insulating layer outside the contact hole, it is possible to suppress a current leak between the upper copper wire (word line or bit line) and the lower copper wire (bit line or word line).

In the above method, a step (E) of forming diode elements such that the diode elements are connected in series with the resistance variable layers, respectively, may be inserted, after the step (C).

In such a method, it is possible to suppress occurrence of a cross talk while flowing a sufficient current when writing or reading data to or from the nonvolatile semiconductor memory device. Therefore, it is possible to manufacture a nonvolatile semiconductor memory device which has high reproducibility in resistance changing characteristic and high reliability.

The method of manufacturing the nonvolatile semiconductor memory device, according to another aspect of the present invention, comprises a step (A) of forming the plurality of stripe-shaped lower copper wires on the substrate; a step (B1') of forming an interlayer insulating layer over the substrate provided with the lower copper wires; a step (B2') of forming a plurality of contact holes in the interlayer insulating layer such that the contact holes penetrate the interlayer insulating layer to surfaces of the lower copper wires, respectively; a step (B3') of forming precious metal electrode layers on the lower copper wires in bottom portions of the contact holes inside the contact holes, respectively, by selective growth plating; a step (C) of filling the resistance variable layers into the contact holes such that the resistance variable layers are connected to the precious metal electrode layers, respectively; and a step (D) of forming the plurality of stripe-shaped upper copper wires on the interlayer insulating layer and the resistance variable layers such that the upper copper wires are connected to the resistance variable layers, respectively, and cross the lower copper wires, respectively.

In such a method, since the planarized precious metal electrode layer can be formed into the contact hole by selective growth plating, it is possible to suppress a current leak between the upper copper wire (word line or bit line) and the lower copper wire (bit line or word line), and processing of the precious metal by lithography or dry etching may be omitted. In addition, since the precious metal electrode layer can be formed only in the bottom portion of the contact hole, an amount of precious metal used can be reduced as compared to the above manufacturing method of forming the precious metal electrode layer on the lower copper wire. Thus, it is possible to manufacture a low-cost and a larger-capacity nonvolatile semiconductor memory device even in the case of using precious metal.

In the above method, also, the step (E) of forming diode elements such that the diode elements are connected in series with the resistance variable layers, respectively, may be inserted, after the step (C).

In the specification and claims, "connected to the resistance variable layer" means "electrically connected to the resistance variable layer," and includes "directly connected to the resistance variable layer (contacts the resistance variable layer)" and "indirectly connected to the resistance variable layer via other conductive layer or the like."

A nonvolatile semiconductor memory device of the present invention, comprises a substrate; a plurality of stripe-shaped lower copper wires formed on the substrate; stripe-shaped precious metal electrode layers stacked on the lower copper wires, respectively; an interlayer insulating layer formed over the substrate provided with the lower copper wires and the precious metal electrode layers; a plurality of contact holes penetrating the interlayer insulating layer to surfaces of the precious metal electrode layers, respectively; the resistance variable layers filled into the contact holes such that the resistance variable layers are connected to the precious metal electrode layers, respectively; and the plurality of stripe-shaped upper copper wires formed on the interlayer insulating layer and the resistance variable layers such that the upper copper wires are connected to the resistance variable layers, respectively, and cross the lower copper wires, respectively.

In such a configuration, since the planarized precious metal electrode layer can be formed into the contact hole without depositing the precious metal electrode layer on the side wall of the contact hole or on the interlayer insulating layer outside the contact hole, it is possible to suppress a current leak between the upper copper wire (word line or bit line) and the lower copper wire (bit line or word line). In addition, since the resistance variable layer is filled into the contact hole, it is possible to achieve a miniaturized configuration and a larger-capacity in the nonvolatile semiconductor memory device. Furthermore, since the precious metal electrode layer serves as a barrier layer for preventing copper from diffusing from the lower copper wire as well as the lower electrode of the resistance variable layer, it is possible to manufacture a highly reliable nonvolatile semiconductor memory device.

The nonvolatile semiconductor memory device having the above configuration may further comprise diode elements connected to the resistance variable layers, respectively.

In such a configuration, it is possible to prevent occurrence of a cross talk between adjacent cells while flowing a sufficient current when writing or reading data to or from the nonvolatile semiconductor memory device. Therefore, it is possible to implement a nonvolatile semiconductor memory device which has high reproducibility in resistance changing characteristic and high reliability.

The nonvolatile semiconductor memory device according to another aspect of the present invention, comprises the substrate; the plurality of stripe-shaped lower copper wires formed on the substrate; the interlayer insulating layer formed over the substrate provided with the lower copper wires; a plurality of contact holes penetrating the interlayer insulating layer to surfaces of the lower copper wires, respectively; precious metal electrode layers formed in bottom regions of the contact holes inside the contact holes, respectively, such that the precious metal electrode layers are connected to the lower copper wires, respectively; the resistance variable layers filled into the contact holes, respectively, such that the resistance variable layers are connected to the precious metal electrode layers, respectively; and the plurality of stripe-shaped upper copper wires formed on the interlayer insulating layer and the resistance variable layers such that the upper copper wires are connected to the resistance variable layers, respectively, and cross the lower copper wires, respectively.

In such a configuration, since the precious metal electrode layer can be formed only in the bottom portion of the contact hole, by selective growth plating, a problem that adjacent lower copper wires get short-circuited because of the presence of the precious metal electrode layer, would not arise, as compared to the above nonvolatile semiconductor memory device in which the precious metal electrode layer is formed on the lower copper wire by selective growth plating.

The above nonvolatile semiconductor memory device having the above configuration may also further comprise diode elements connected to the resistance variable layers, respectively.

The above and further objects, features and advantages of the present invention will more fully be apparent from the following detailed description of preferred embodiments with reference to accompanying drawings.

Advantageous Effects of the Invention

The present invention has been configured as described above, and has advantages that it is possible to provide a nonvolatile semiconductor memory device which includes a cross-point ReRAM using precious metal such as Pt as electrode material, can suppress a current leak between a word line and a bit line and can achieve a miniaturized configuration and a larger capacity, and a manufacturing method thereof.

BRIEF DESCRIPTION OF THE DRAWINGS

FIG. 5 is a view showing a step of forming contact holes in predetermined locations of the interlayer insulating layer, respectively, in the manufacturing method of the nonvolatile semiconductor memory device according to Embodiment 1 of the present invention, in which FIG. 5(a) is a plan view and FIG. 5(b) is a cross-sectional view taken in the direction of arrow along line 5A-5A of FIG. 5(a).

FIG. 7 is a view showing a state where an upper copper wire is formed such that it is connected to the resistance variable layer, in the manufacturing method of the nonvolatile semiconductor memory device according to Embodiment 1 of the present invention, in which FIG. 7(a) is a plan view and FIG. 7(b) is a cross-sectional view taken in the direction of arrow along line 7A-7A of FIG. 7(a).

FIG. 8(a) is a cross-sectional view showing a configuration of a nonvolatile semiconductor memory device according to Embodiment 2 of the present invention, in which FIG. 8(b) is a cross-sectional view of partially enlarged major constituents showing a configuration of a memory section and a diode element in the nonvolatile semiconductor memory device according to Embodiment 2 of the present invention.

DESCRIPTION OF EMBODIMENTS

Hereinafter, embodiments of the present invention will be described with reference to the drawings. The same constituents are designated by the same reference symbols and will not be described repetitively in some cases. It should be noted that transistors, memory sections, and others are schematically depicted and the number of them, or the like are set for easier illustration.

Embodiment 1

Figure 1:
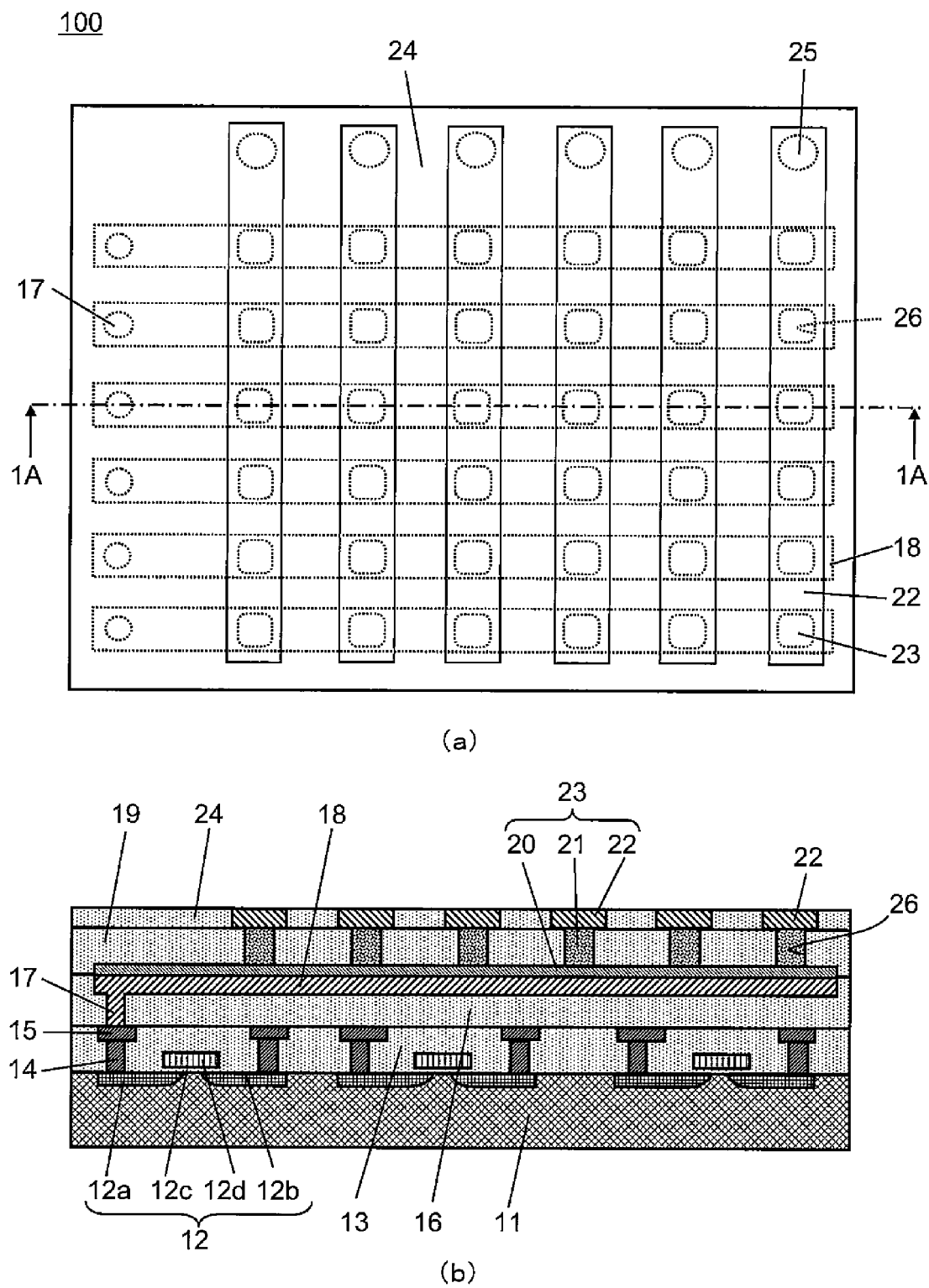
FIG. 1(a) is a plan view showing a configuration of a nonvolatile semiconductor memory device according to Embodiment 1 of the present invention.
FIG. 1(b) is a cross-sectional view taken in the direction of arrow along line 1A-1A of FIG. 1(a).
Figure 2:
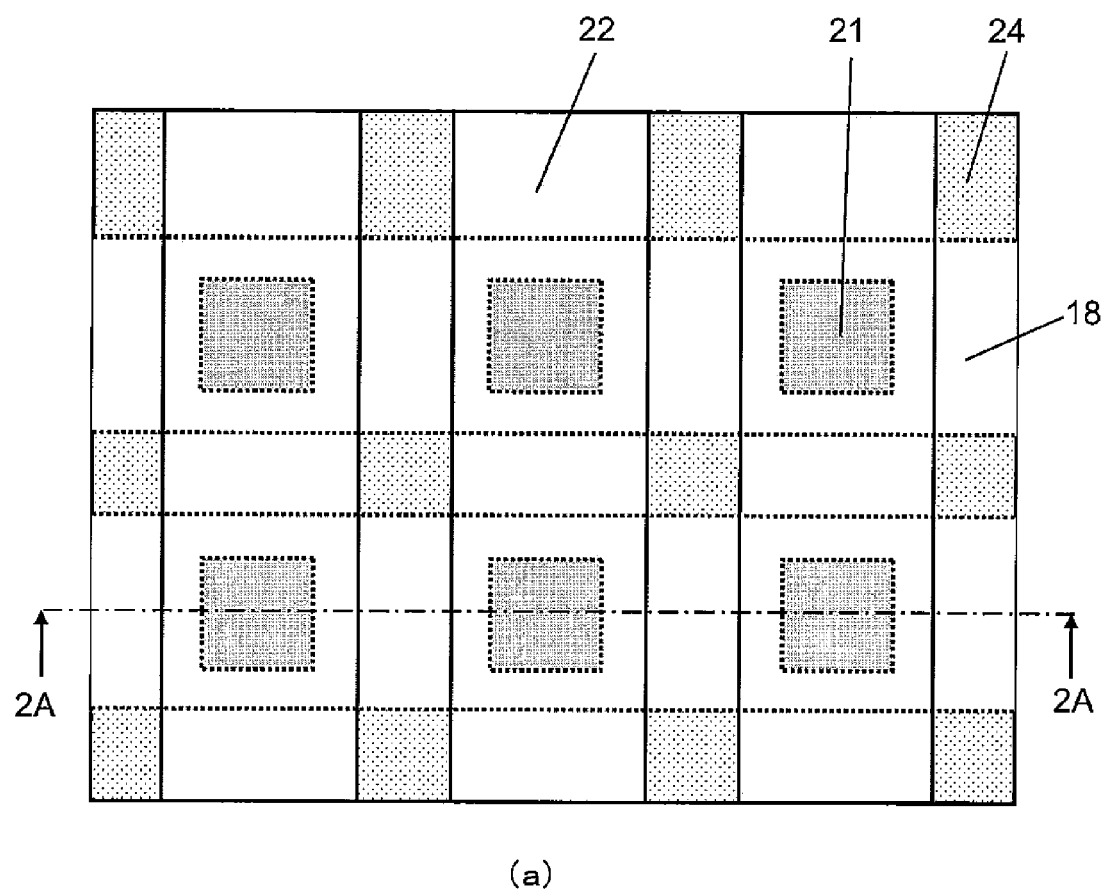
FIG. 2(a) is a plan view of partially enlarged major constituents, showing a configuration of a memory section in a nonvolatile semiconductor memory device according to Embodiment 1 of the present invention.
FIG. 2(b) is a cross-sectional view taken in the direction of arrow along line 2A-2A of FIG. 2(a).
Figure 2:
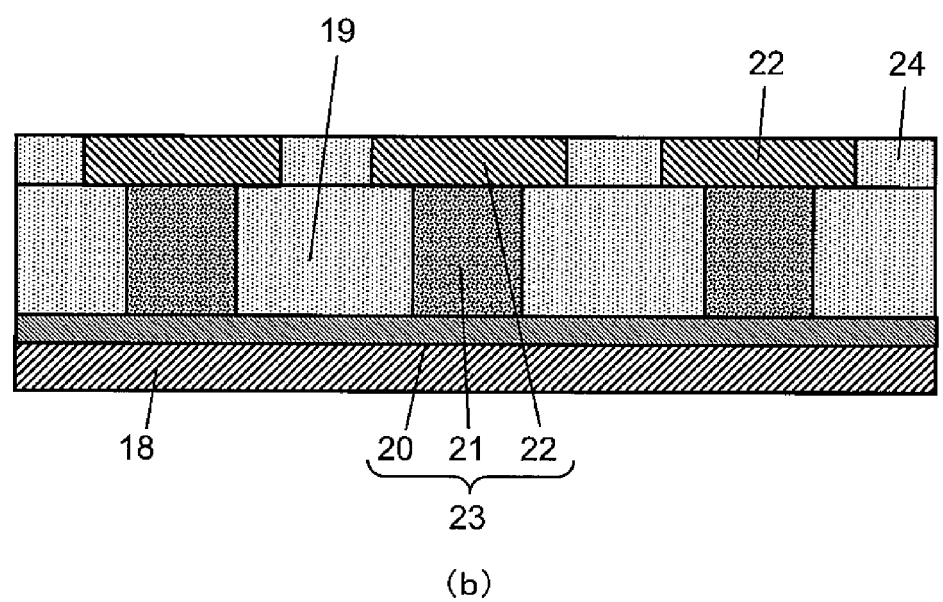

FIG. 1 is views showing a configuration of a nonvolatile semiconductor memory device 100 according to Embodiment 1 of the present invention, in which FIG. 1(a) is a plan view and FIG. 1(b) is a cross-sectional view taken in the direction of arrow along line 1A-1A of FIG. 1(a). FIG. 2 is views of partially enlarged major constituents, showing a configuration of a memory section 23, in which FIG. 2(a) is a plan view and FIG. 2(b) is a cross-sectional view taken in the direction of arrow along line 2A-2A of FIG. 2(a).

As shown in FIGS. 1 and 2, a nonvolatile semiconductor memory device 100 of this embodiment includes a substrate 11, a plurality of stripe-shaped lower copper wires 18 formed on the substrate 11, precious metal electrode layers 20 formed over the lower copper wires 18, respectively, an interlayer insulating layer 19 formed on the substrate 11 provided with the lower copper wires 18 and the precious metal electrode layers 20, a plurality of contact holes formed in the interlayer insulating layer 19 to reach the precious metal electrode layers 20, respectively, resistance variable layers 21 filled into the contact holes and connected to the precious metal electrode layers 20, respectively, and a plurality of upper copper wires 22 formed in an interlayer insulating layer 24 over the interlayer insulating layer 19.

The plurality of lower copper wire layers 18 respectively have a stripe shape and are arranged to be spaced apart from each other in a width direction thereof.

The precious metal electrode layers 20 are stacked on the lower copper wire layers 18, respectively. The precious metal electrode layers 20 substantially overlap with (substantially have the same shape as that of) the lower copper wire layers 18, respectively, when viewed in the direction in which they are stacked together. The precious metal electrode layer 20 may comprise one kind of precious metal, stacked layers of two or more kinds of precious metals, or one kind of precious metal doped with another metal. By configuring the precious metal electrode layer 20 in the above described manner, it is possible to prevent an event that precious metal contained in the precious metal electrode layer 20 migrates to the resistance variable layer and thereby an interface of the resistance variable layer gets uneven.

In this embodiment, the upper copper wires 22 are formed in stripe shape to cross (e.g., in a direction perpendicular to) the lower copper wires 18, respectively, on the interlayer insulating layer 19. The plurality of upper copper wires 22 respectively have stripe shape and are arranged to be spaced apart from each other in the width direction. The contact holes 26 are formed at cross points of the upper copper wires 22 and the lower copper wires 18, respectively. The plurality of contact holes 26 are formed to correspond to the precious metal electrode layers 20, respectively. Each of the contact holes 26 is filled with the resistance variable layer 21. The resistance variable layer 21, a region of the precious metal electrode layer 20 which is connected to this resistance variable layer 21 and a region of the upper copper wire 22 which is connected to this resistance variable layer 21 constitute a memory section 23. As the resistance variable layer 21, for example, an oxygen-deficient transition metal oxide layer or a perovskite oxide layer may be used. As the oxygen-deficient transition metal oxide layer, for example, a tantalum oxide layer ($TaO_x$), a nickel oxide layer ($NiO_x$), a hafnium oxide layer ($HfO_x$), an iron oxide layer ($FeO_x$), a vanadium oxide layer ($VO_x$), a zinc oxide layer ($ZnO_x$), a niobium oxide layer ($NbO_x$), a titanium oxide layer ($TiO_x$), a tungsten oxide layer ($WO_x$), a cobalt oxide layer ($CiO_x$), a copper oxide layer ($CuO_x$), etc., may be used. As the perovskite oxide layer, for example, $PrCaMnO_3$, $LaCaMnO_3$, $SrTiO_3$, etc., may be used. Among these, the oxygen-deficient tantalum oxide ($TaO_x$) is favorable in terms of stability of a resistance changing characteristic, reproducibility in manufacturing, etc. Hereinafter, an example in which the resistance variable layer 21 comprises the oxygen-deficient tantalum oxide ($TaO_x$) will be described. As used herein, the term "oxygen-deficient" refers to a composition which is less in oxygen content than a stoichiometric composition in regard to a content ratio between Ta and O. A range of x in $TaO_x$ is preferably $0<x<2.5$, and more preferably, $0.8 \leq x \leq 1.9$. As shown in FIG. 1, the upper copper wire 22 extends to outside an area where the memory sections 22 are arranged in matrix.

In this embodiment, the substrate 11 is a silicon monocrystal substrate and includes a semiconductor circuit in which active elements 12 such as transistors are integrated. In FIG. 1, each active element 12 is depicted as a transistor composed of a source region 12a, a drain region 12b, a gate insulating layer 12c and a gate electrode 12d. In addition to the active elements 12, elements generally required for a memory circuit such as DRAM are provided in the semiconductor circuit.

The lower copper wire 18 and the upper copper wire 22 are each connected (to be precise, electrically connected) to the active element 12 in an area different from a matrix area in which the memory sections 23 are arranged. To be specific, in FIG. 1, the lower copper wire 18 is connected to the source region 12a of the active element 12 via embedded conductors 14 and 17 and a semiconductor electrode wire 15. The upper copper wire 22 is connected to another active element (not shown) via an embedded conductor 25.

In this embodiment, as the interlayer insulating layers 19 and 24, silicon oxide ($SiO_2$) deposited by the CVD, TEOS-$SiO_2$ layer deposited using ozone ($O_3$) and tetraethoxysilane (TEOS) by CVD, silicon oxycarbite (SiOC) layer which is a low dielectric constant material, a fluorine-doped silicon oxide (SiOF) layer, etc. may be used.

To easily form the contact hole in the interlayer insulating layer 19, a plurality of interlayer insulating layers may be formed in such a manner that a lower layer of the interlayer insulating layer 19 is formed using a material having etching resistance to dry etching using fluorinated etching gas, to be specific, a silicon nitride (SiN) layer, silicon oxynitride (SiON) layer, a silicon carbon nitride (SiCN) layer, etc., and an upper layer of the interlayer insulating layer 19 is formed using an insulative oxide layer other than SiN and SiON.

The resistance variable layer 21 constituting the memory section 23 may be deposited using the above mentioned oxygen-deficient transition metal oxide, by sputtering or the like. Such an oxygen-deficient transition metal oxide exhibits specific resistance values by application of voltages or currents which are not less than thresholds and retain the resistance values until pulse voltages or pulse currents with certain magnitudes are newly applied thereto.

Next, a manufacturing method of the nonvolatile semiconductor memory device 100 of this embodiment will be described with reference to FIGS. 3 to 7.

Figure 3:
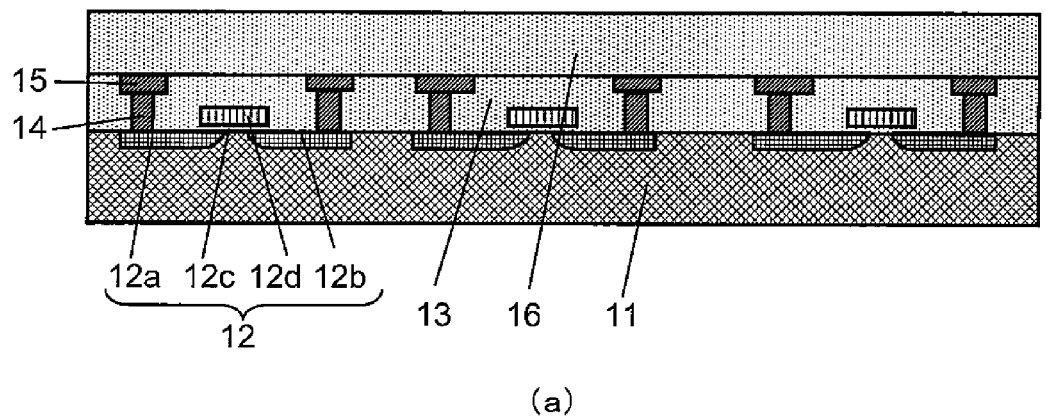
FIGS. 3(a) to 3(c) are cross-sectional views showing steps from a step of forming an interlayer insulating layer on a substrate provided with active elements, to a step of further forming lower copper wires thereon, in a manufacturing method of a nonvolatile semiconductor memory device according to Embodiment 1 of the present invention.
Figure 3:
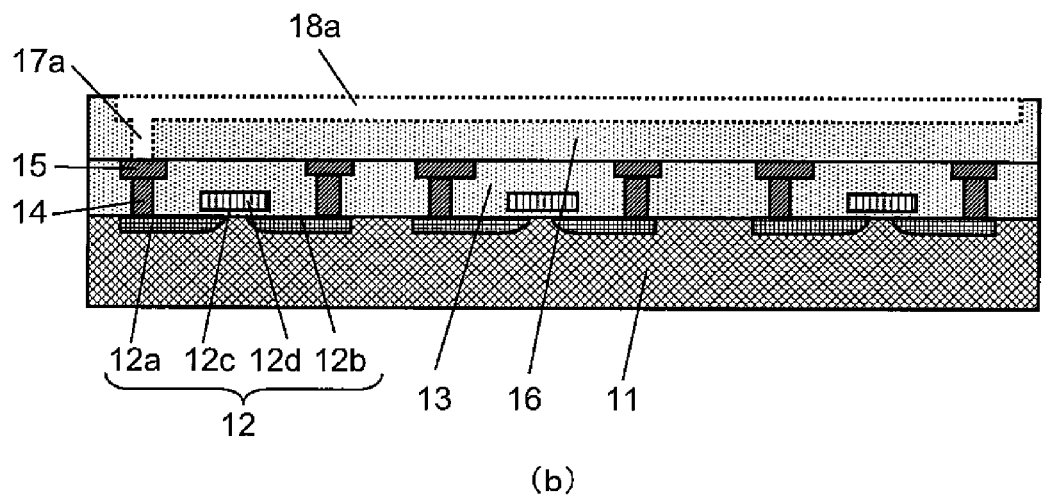
Figure 3:
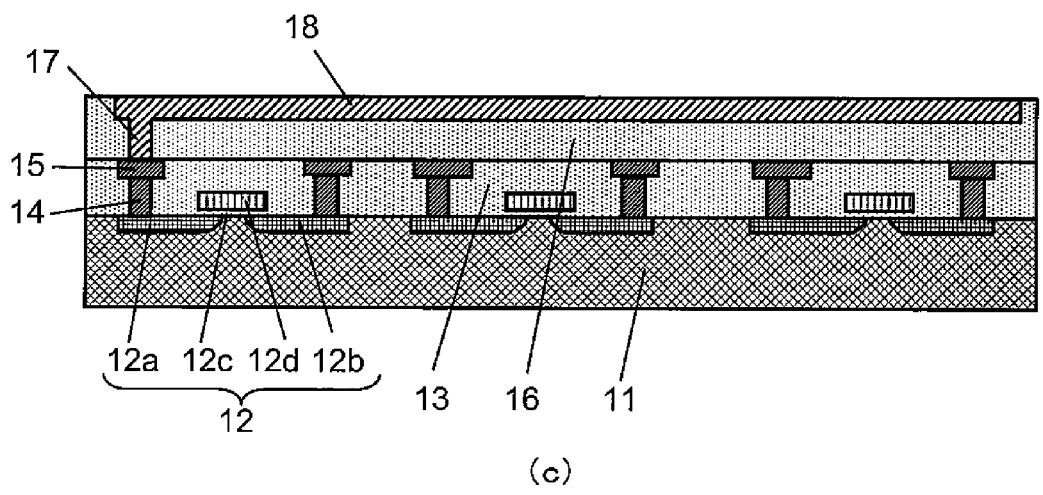

FIG. 3 is views showing steps from a step of forming the interlayer insulating layer 16 on the substrate 11 provided with the active elements 12, to a step of forming the lower copper wire 18 and the embedded conductor 17. FIG. 3(a) is a cross-sectional view showing a state where the interlayer insulating layer 16 is formed over the substrate 11 provided with the active elements 12. FIG. 3(b) is a cross-sectional view showing a state where the stripe-shaped wire trench 18a and a contact hole 17a connected to the electrode wire 15 are formed in predetermined locations in the interlayer insulating layer 16. FIG. 3(c) is a cross-sectional view showing a state where the lower copper wire 18 and the embedded conductor 17 are embedded in the interlayer insulating layer 16 by a dual damascene process.

Initially, in the steps shown in FIGS. 3(a) and 3(b), on the substrate 11 provided with the plurality of active elements 12, the embedded conductors 14, the electrode wires 15 and the interlayer insulating layer 13, the interlayer insulating layer 16 is formed. As the embedded conductor 14 and the electrode wire 15, aluminum (Al) was commonly used conventionally, but copper which can implement low resistance even in a miniaturized structure is recently used. As the interlayer insulating layers 13 and 16, a fluorine-containing oxide (e.g., SiOF), carbon-containing nitride (e.g., SiCN), or an organic resin material (e.g., polyimide) is used to reduce a parasitic capacitance between wires. In this embodiment, as the electrode wire 15, copper (Cu) may be used, while as the semiconductor interlayer insulating layers 13 and 16, for example, SiOF which is a fluorine-containing oxide, may be used.

Then, in the step of FIG. 3(c), the lower copper wire 18 is embedded into the interlayer insulating layer 16 (step A). This is carried out as follows. Firstly, as shown in FIG. 3(b), the stripe-shaped wire trench 18a into which the lower copper wire 18 is filled and the contact hole 17a connected to the semiconductor electrode wire 15 are formed in the semiconductor interlayer insulating layer 16. These constituents can be easily formed using a technique used in a general semiconductor process. After the wire trench 18a and the contact hole 17a are formed, and a conductive layer which becomes the lower copper wire 18 and the embedded conductor 17 are formed such that copper is filled into the wire trench 18a and the contact hole 17a, the lower copper wire 18 and the embedded conductor 17 having a shape shown in FIG. 3(c) can be embedded by, for example, CMP. It should be noted that the copper wire may have a stacked-layer structure including a barrier metal layer underlying a copper layer and a metal cap layer overlying the copper layer to suppress copper from diffusing to the interlayer insulating layer. As the barrier metal layer or the top cap layer of the copper wire, CoWP, TiWN, Ti, TiN, Ta, or TaN is generally used. Although in this embodiment, the lower copper wire 18 and the embedded conductor 17 are embedded in the interlayer insulating layer 16 by the dual damascene process, the lower copper wire 18 and the embedded conductor 17 may be embedded individually in the interlayer insulating layer 16 by a single damascene process.

Figure 4:
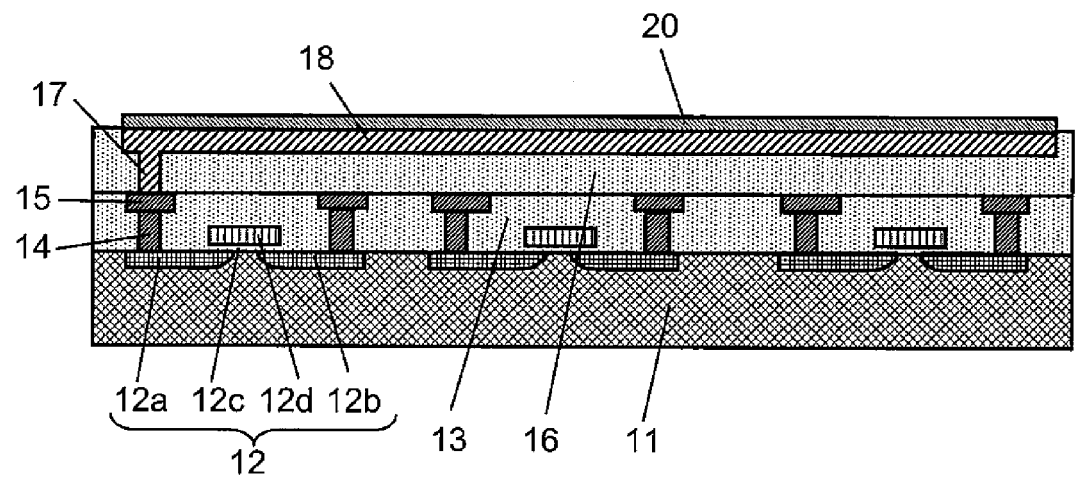
FIGS. 4(a) and 4(b) are cross-sectional views showing a step of forming a precious metal electrode layer on the interlayer insulating layer including the lower copper wire and a step of further forming an interlayer insulating layer thereover, in the manufacturing method of the nonvolatile semiconductor memory device according to Embodiment 1 of the present invention.
Figure 4:
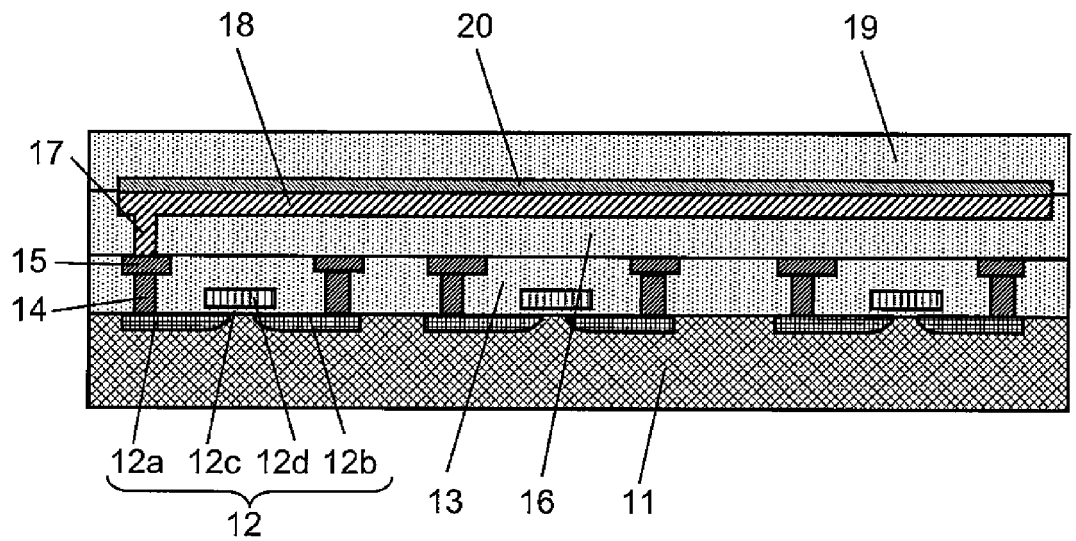

FIG. 4 is views showing steps from a step of forming the precious metal electrode layer 20 using selective growth plating, to a step of forming the interlayer insulating layer 19 over the interlayer insulating layer 16 including the lower copper wire 18 and the precious metal electrode layer 20. FIG. 4(a) is a cross-sectional view showing a state where the precious metal electrode layer 20 is formed on the lower copper wire 18, and FIG. 4(b) is a cross-sectional view showing a state where an interlayer insulating layer 19 is formed on the interlayer insulating layer 16 including the lower copper wire 18 and the precious metal electrode layer 20.

In the step shown in FIG. 4(a), the precious metal electrode layers 20 of stripe shape are stacked on the lower copper wires 18, respectively, by selective growth plating (step B1). In this embodiment, the precious metal electrode layer 20 is formed on copper by electroless selective growth plating. In this embodiment, since the oxygen-deficient tantalum oxide ($TaO_x$) is used as the resistance variable layer 21, platinum (Pt) which is an electrode material which allows $TaO_x$ to change its resistances favorably is suitably used as the precious metal electrode layer 20. As electroless Pt plating solution, hydrazine-ammonia Pt plating solution, Pt plating solution containing as a reducing agent boron compound or hypophosphorous acid, etc., may be used. The layer thickness of the Pt electrode layer may be set to not less than 5 nm and not more than 24 nm. By thinning the Pt electrode layer so that the layer thickness falls within this range, generation of hillocks of Pt due to thermal treatment can be suppressed and an interface of the resistance variable layer and the Pt electrode layer can be plararized. By conducting the above Pt electroless plating after forming an electrode seed layer containing one of nickel, nickel-phosphorus alloy, or nickel-boron alloy, on the lower copper wire 18, Pt can be selectively grown on Cu more efficiently. Alternatively, the electrode seed layer may have a stacked-layer structure of a combination of a palladium layer and a nickel layer, a combination of the palladium layer and a nickel-phosphorus alloy layer, or a combination of the palladium layer and a nickel-boron alloy layer.

If a wire pattern is devised so that a voltage can be applied to the lower copper wires 18 all together from outside in the step of forming the precious metal electrode layer 20, electroplating may be used.

By using the selective growth plating, the precious metal electrode layer 20 is selectively formed only on the lower copper wire 18 embedded in the interlayer insulating layer 16, and is not formed on the interlayer insulating layer 16. Therefore, the precious metal electrode layers 20 are formed in stripe shape on the lower copper wires 18, respectively, similarly to the lower copper wires 18, without necessity of shape processing using exposure, or etching.

Then, in the step of FIG. 4(b), the interlayer insulating layer 19 comprising $TEOS-SiO_2$ is formed by, for example, CVD, on the substrate 11 including the lower copper wire 18 and the precious metal electrode layer 20 (step B2). As the interlayer insulating layer 19, various materials may be used as described above.

Figure 5:
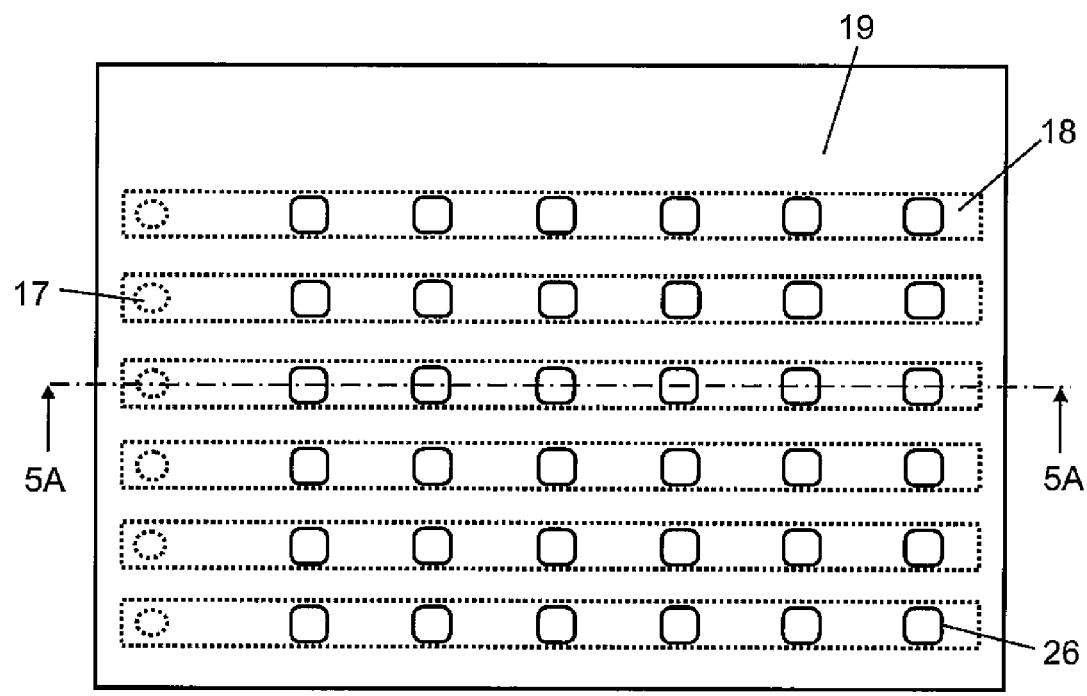
Figure 5:
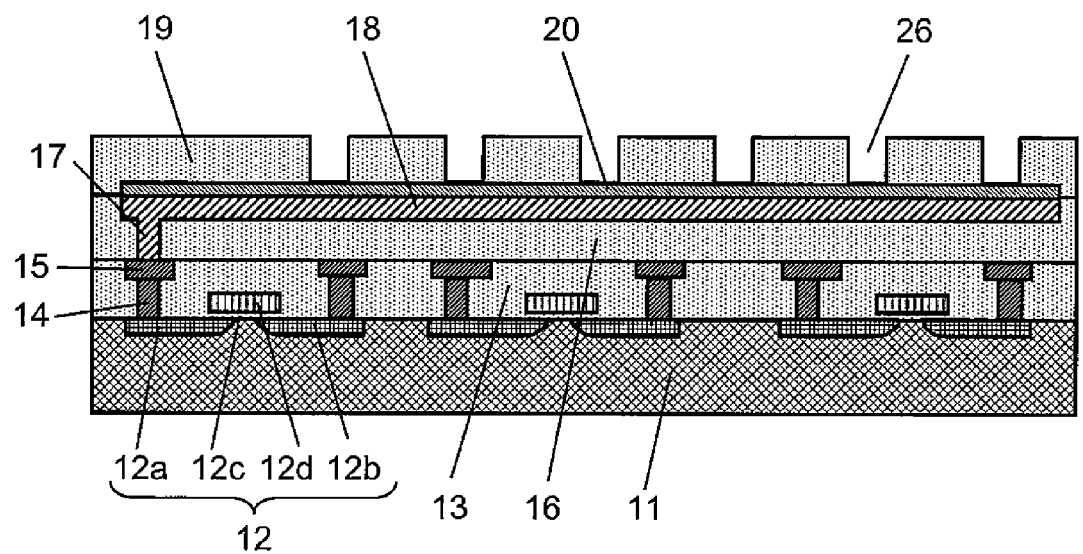

FIG. 5 is views showing a step of forming the contact holes 26 in predetermined locations of the interlayer insulating layer 19, in which FIG. 5(a) is a plan view showing a state where the contact holes 26 are formed in predetermined locations of the interlayer insulating layer 19, and FIG. 5(b) is a cross-sectional view taken in the direction of arrow along line 5A-5A of FIG. 5(a), In the step of FIG. 5, a plurality of contact holes 26 are formed to penetrate the interlayer insulating layer 19 to surfaces of respective metal electrode layers 20, respectively (step B3). In this embodiment, the contact holes 26 are formed at constant arrangement pitches along a lengthwise direction of each metal electrode layer 20. As can be seen from FIG. 5(a), each contact hole 26 has an outer shape smaller than a width of the lower copper wire 18 and a width of the precious metal electrode layer 20 formed on the lower copper wire 18. Although the contact hole 26 has a rectangular shape as shown in FIG. 5, it may have a circular shape, an oval shape, or other shape.

Figure 6:
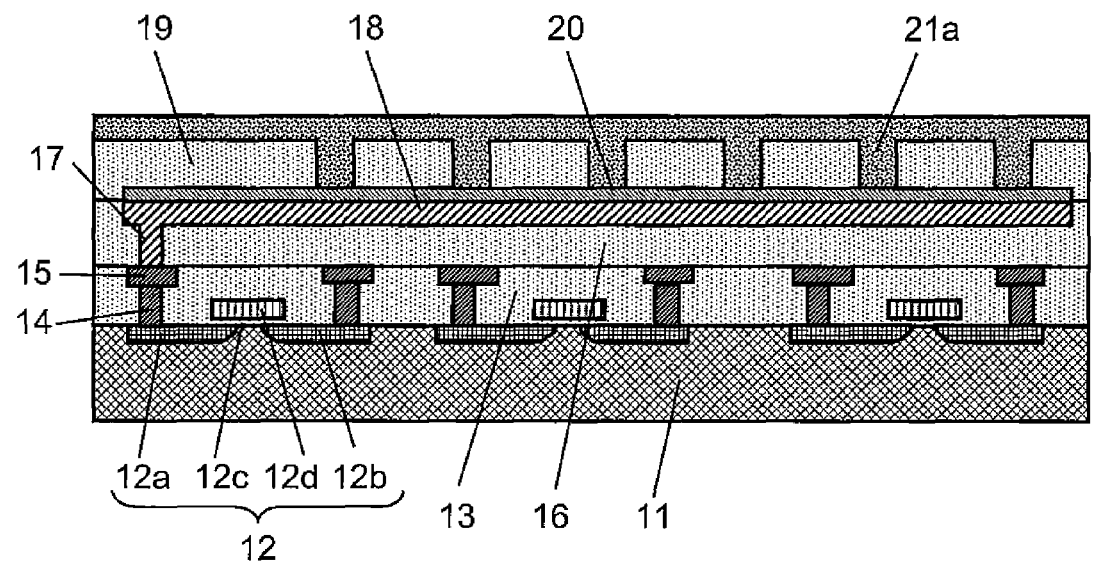
FIGS. 6(a) and 6(b) are views showing a step of filling a resistance variable layer into the contact hole, in the manufacturing method of a nonvolatile semiconductor memory device according to Embodiment 1 of the present invention.
Figure 6:
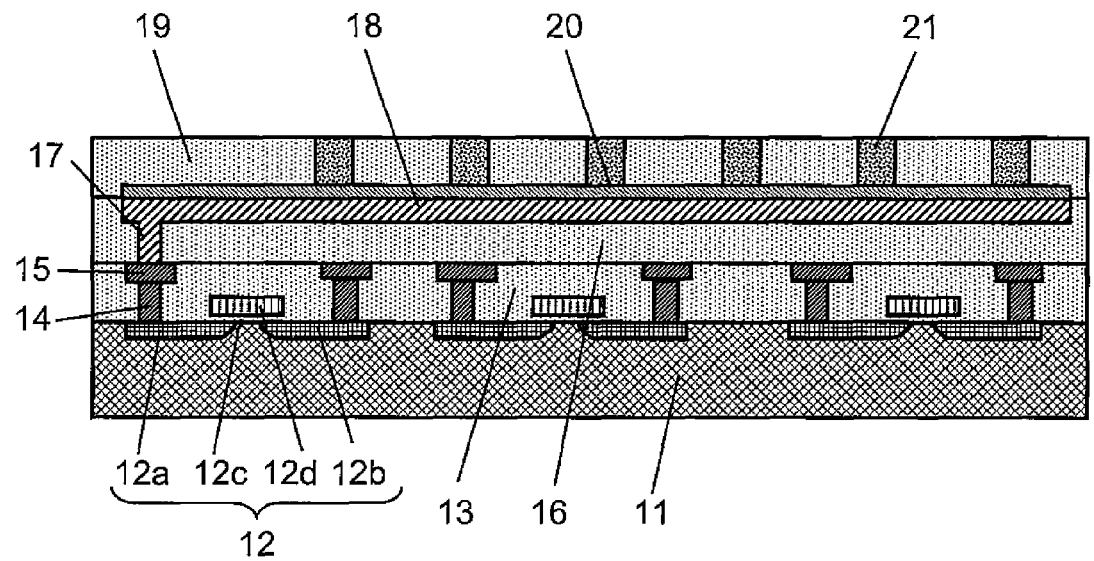

FIG. 6 is views showing steps of filling the resistance variable layer 21 into the contact hole 26. FIG. 6(a) is a cross-sectional view showing a state where a resistance variable thin layer 21a which becomes the resistance variable layer 21 is formed over the interlayer insulating layer 19 including the contact hole 26, and FIG. 6(b) is a cross-sectional view showing a state where the resistance variable thin layer 21a formed over the interlayer insulating layer 19 is removed, by CMP.

In the step of FIG. 6(a), the resistance variable thin layer 21a which becomes the resistance variable layer 21 is formed over the interlayer insulating layer 19 including the contact hole 26. In this embodiment, as the resistance variable layer 21, the oxygen-deficient tantalum oxide ($TaO_x$) is deposited by sputtering. As a deposition method, CVD, ALD or the like may be used, instead of sputtering.

Alternatively, after forming a metal Ta layer, the Ta layer may be oxidized to form $TaO_x$.

Then, in the step of FIG. 6(b), the resistance variable thin layer 21a formed over the interlayer insulating layer 19 is removed, by CMP. In this way, the resistance variable layers 21 are filled into the contact holes 26 such that the resistance variable layers 21 are connected to the precious metal electrodes 20, respectively (step C). To remove the resistance variable thin layer 21a, etch back may be used instead of CMP. To fill the resistance variable layer 21 into the contact hole 26, selective growth plating may be used instead of the above method.

Figure 7:
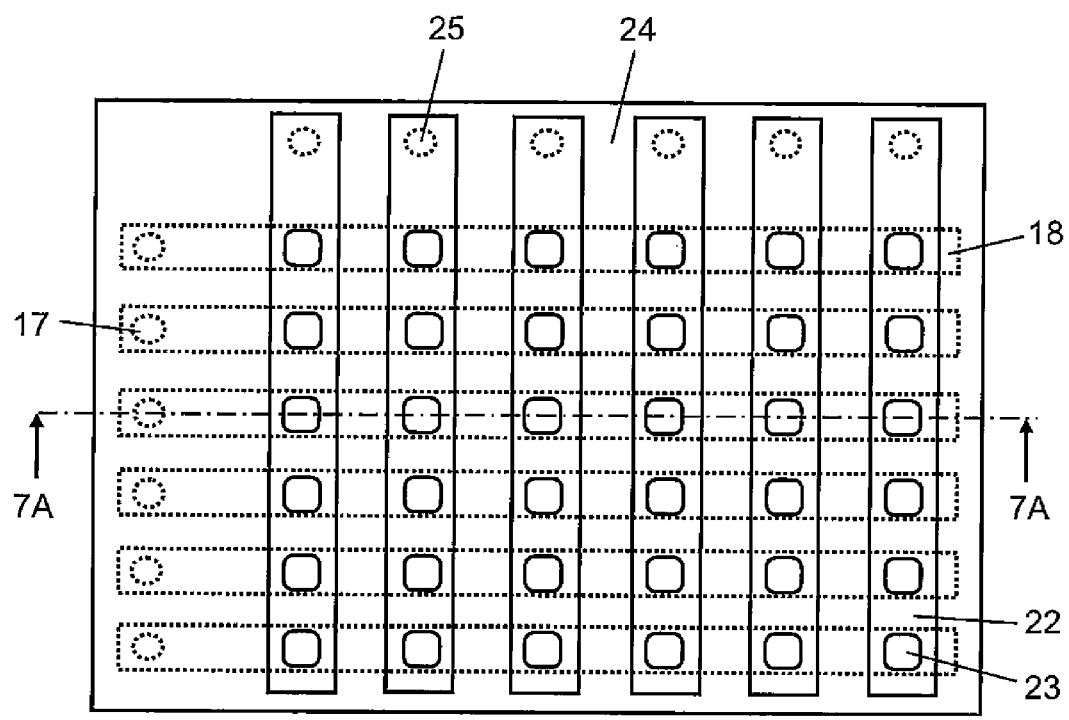
Figure 7:
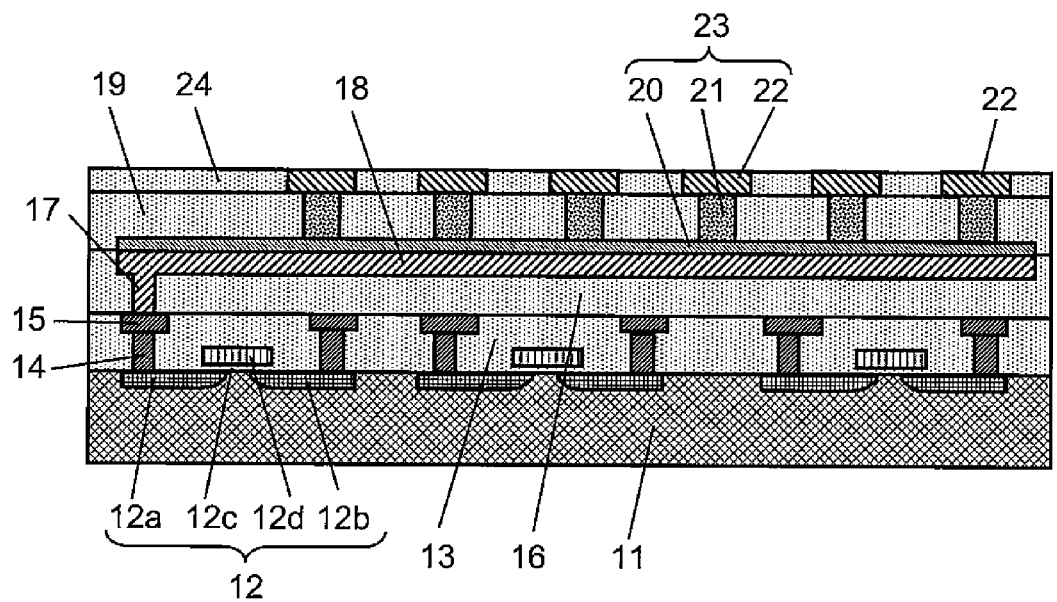

FIG. 7 is views showing a state where the upper copper wire 22 is formed on the interlayer insulating layer 19 such that the upper copper wire 22 is connected to the resistance variable layer 21, in which FIG. 7(a) is a plan view and FIG. 7(b) is a cross-sectional view taken in the direction of arrow along line 7A-7A of FIG. 7(a).

In the step of FIG. 7, an interlayer insulating layer 24 is formed over the resistance variable layer 21 and the interlayer insulating layer 19, and the upper copper wires 22 are formed in the interlayer insulating layer 24 such that the upper copper wires 22 are connected to the resistance variable layers 21, respectively (step D), like a method of forming the lower copper wires 18. In this case, the upper copper wires 22 are formed in stripe shape on the interlayer insulating layer 19 such that the upper copper wire 22 has a larger shape than at least the contact hole 26 and crosses the corresponding lower copper wire 18. In this embodiment, as the upper copper wire 22, a material similar to that used for the lower copper wire 18 may be used.

Concurrently with the formation of the upper copper wire 22, the embedded conductor 25 is formed (conductor material is filled into predetermined contact hole). Via the embedded conductor 25, the upper copper wire 22 is connected to an electrode wire (not shown), and electrically connected to the active element provided in a location which is not shown. Through the above steps, manufacturing of the nonvolatile semiconductor memory device 100 shown in FIG. 1 is accomplished.

Although in this embodiment, Pt is used as the precious metal electrode layer 20, palladium (Pd) may be used instead of platinum. As electroless Pd plating solution, hydrazine-ammonia Pd plating solution, Pd plating solution containing as a reducing agent boron compound or hypophosphorous acid, etc., may be used. The layer thickness of the Pd electrode layer may be set to not less than 5 nm and not more than 24 nm. By thinning the Pd electrode layer so that the layer thickness falls within this range, generation of hillocks of Pd due to thermal treatment can be suppressed and an interface of the resistance variable layer and the Pd electrode layer can be plararized. By conducting the above Pd electroless plating after forming an electrode seed layer containing one of nickel, nickel-phosphorus alloy, or nickel-boron alloy, on the lower copper wire 18, Pd can be selectively grown on Cu more efficiently.

Figure 18:
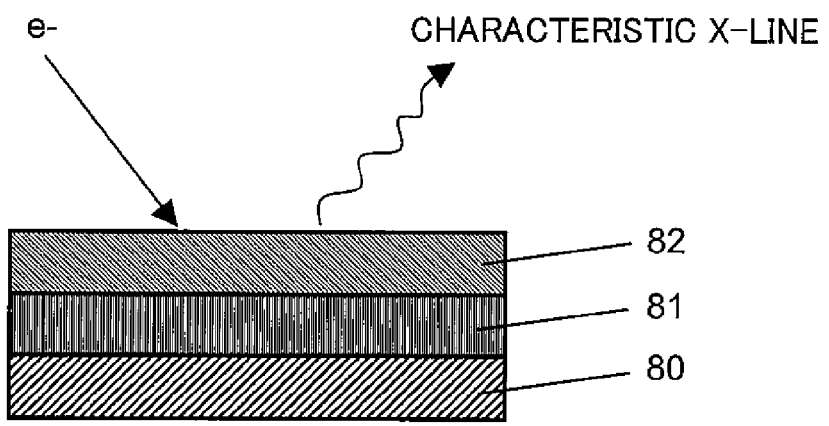
FIGS. 18(a) and 18(b) are views showing X-ray analysis result of a precious metal electrode layer surface in a case where a palladium precious metal electrode layer is formed on a lower copper wire by electroless Pd plating via a nickel electrode seed layer.
Figure 18:
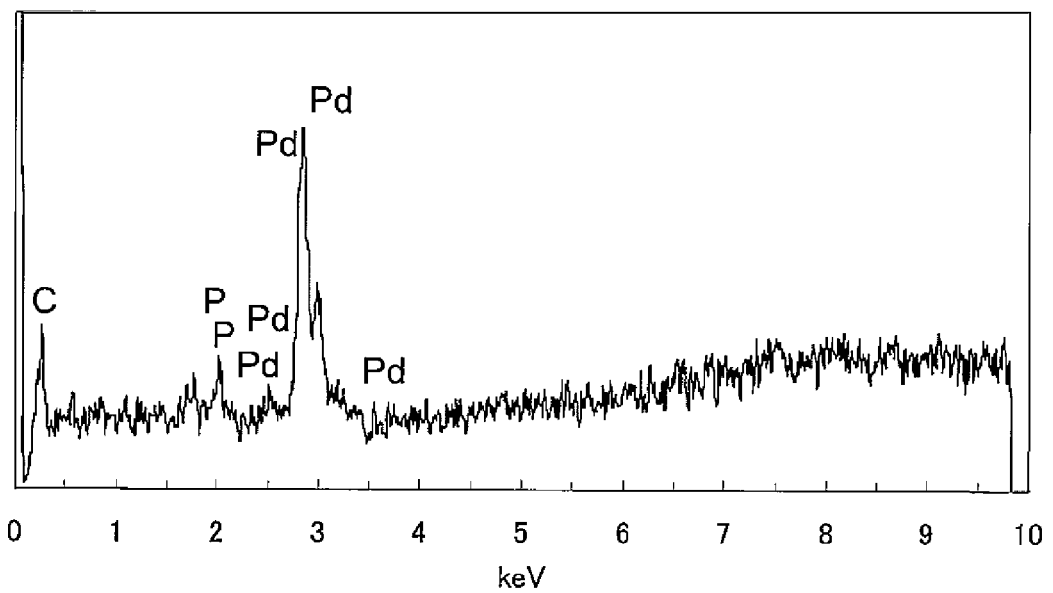
Figure 19:
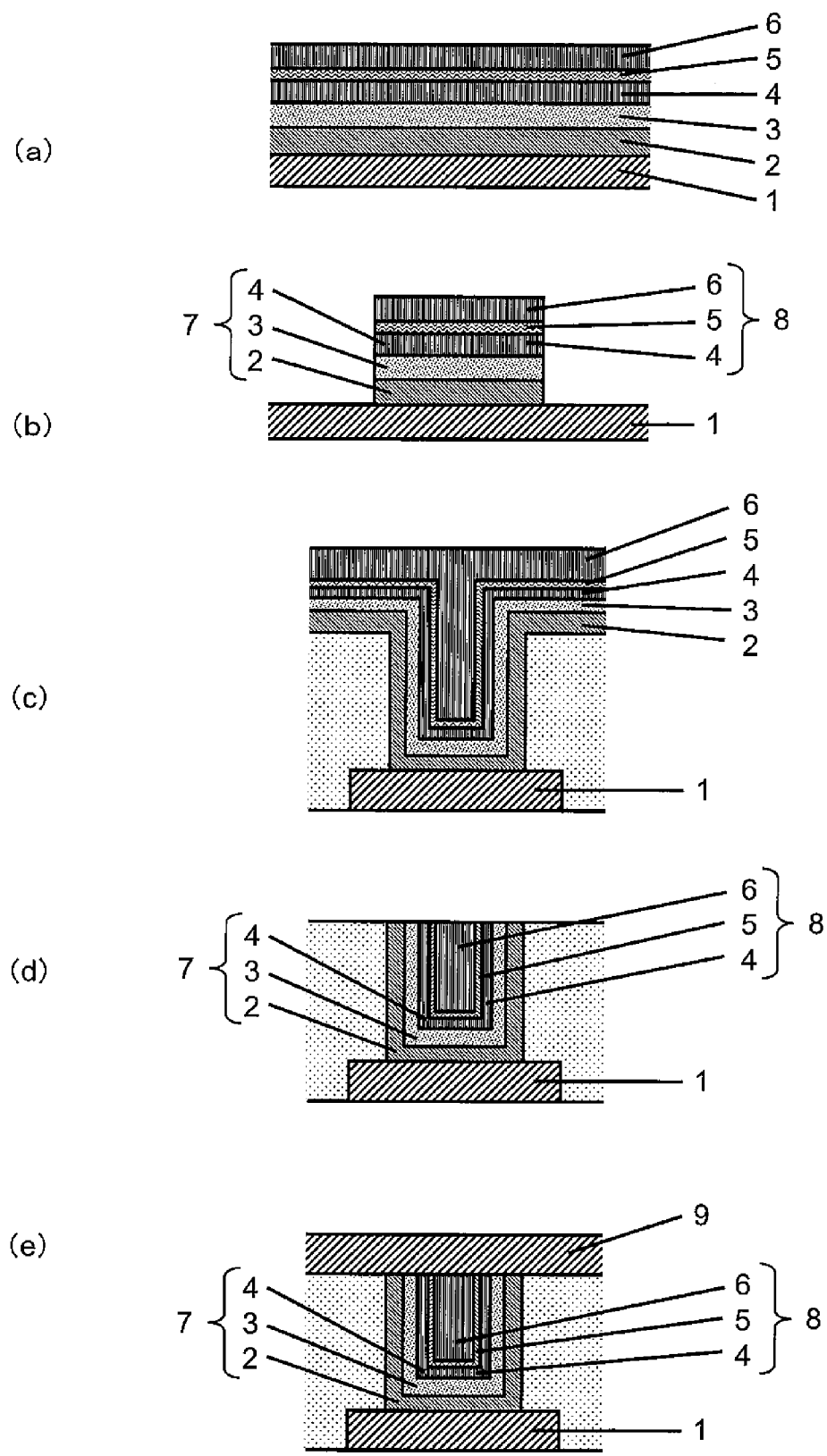
FIGS. 19(a) to 19(e) are cross-sectional views showing major steps of a manufacturing method of a conventional nonvolatile semiconductor memory device.

Now, description will be given of a result of analysis of a surface of the precious metal electrode layer 20 which was conducted to research elements thereon, using a X-ray analyzing device, in a case where the precious metal electrode layer 20 of palladium is formed by electroless Pd plating on the lower copper wire 18 via the electrode seed layer of nickel. FIG. 18 is views showing the X-ray analysis result of the precious metal electrode layer surface in a case where the palladium precious metal electrode layer is formed by electroless Pd plating on the lower copper wire via the nickel electrode seed layer.

In the example of FIG. 18, a sample was prepared in such a manner that a nickel electrode seed layer 81 was formed on a copper wire layer 80 by electroless Ni plating, and a palladium precious metal electrode layer 82 was formed on the electrode seed layer 81 by electroless Pd plating. In this case, a plating solution containing phosphorus was used in the electroless Ni plating and the electroless Pd plating. This sample was analyzed to research elements using SEM-EDX (scanning electron microscope and energy dispersive X-ray spectroscopy) (ENERGY EX-250) manufactured by HORIBA, ltd. To be specific, the sample was analyzed to research elements in such a manner that electrons were emitted to the surface of the precious metal electrode layer 82 of the sample, and a reflected characteristic X-ray was detected. An accelerating voltage of SEM was 15 keV and an analysis range of EDX was 100 nm×100 nm.

As a result, as shown in FIG. 18(b), a peak of phosphorus which was a component of the plating solution was observed in addition to a peak of palladium which was a major component of the precious metal electrode layer 82. From this, it was presumed that the precious metal electrode layer 82 formed by the electroless Pd plating using the plating solution containing phosphorus contained phosphorus in addition to palladium. Although a peak of carbon was also observed in the example of FIG. 18(b), this was contamination in the SEM and was irrelevant to elements of the precious metal electrode layer 82.

Likewise, it was presumed that the precious metal electrode layer 20 formed by the electroless Pt plating using the plating solution containing phosphorus contained phosphorus in addition to platinum. Also, it was presumed that a precious metal electrode layer formed using another plating solution containing no phosphorus contained an element which contributed to a reaction of electroless plating and was other than an element of a metal layer component.

As should be appreciated from the above, it may be presumed that when element analysis is conducted for the precious metal electrode layer 20 formed in the manufacturing method of this embodiment, the element which contributes to the reaction of electroless plating and is other than the element of the metal layer component is detected, in addition to the precious metal.

Embodiment 2

Figure 8:
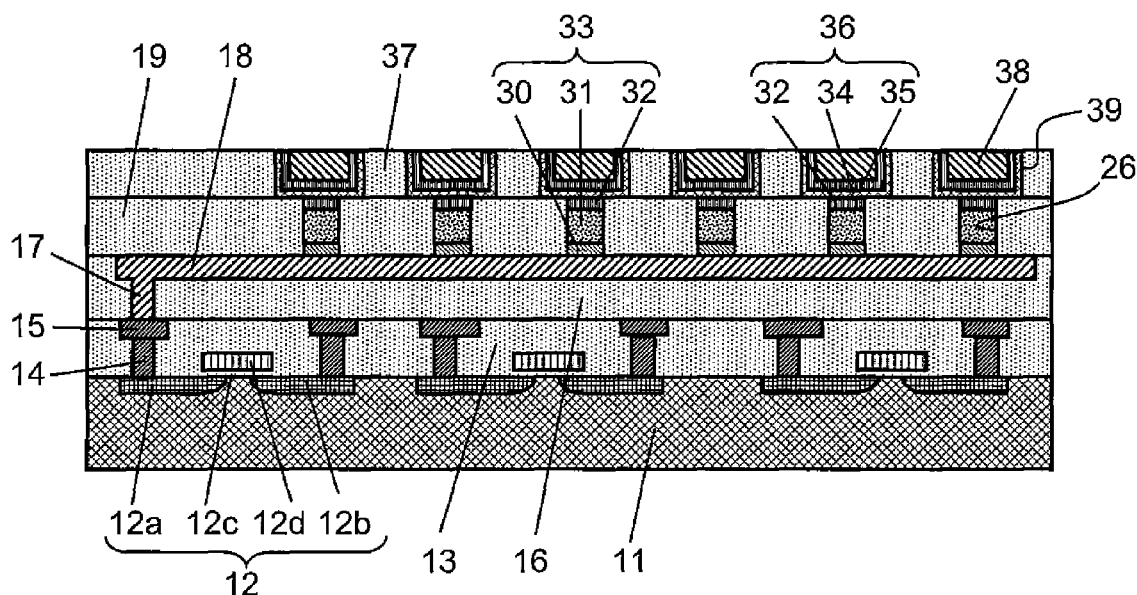
Figure 8:
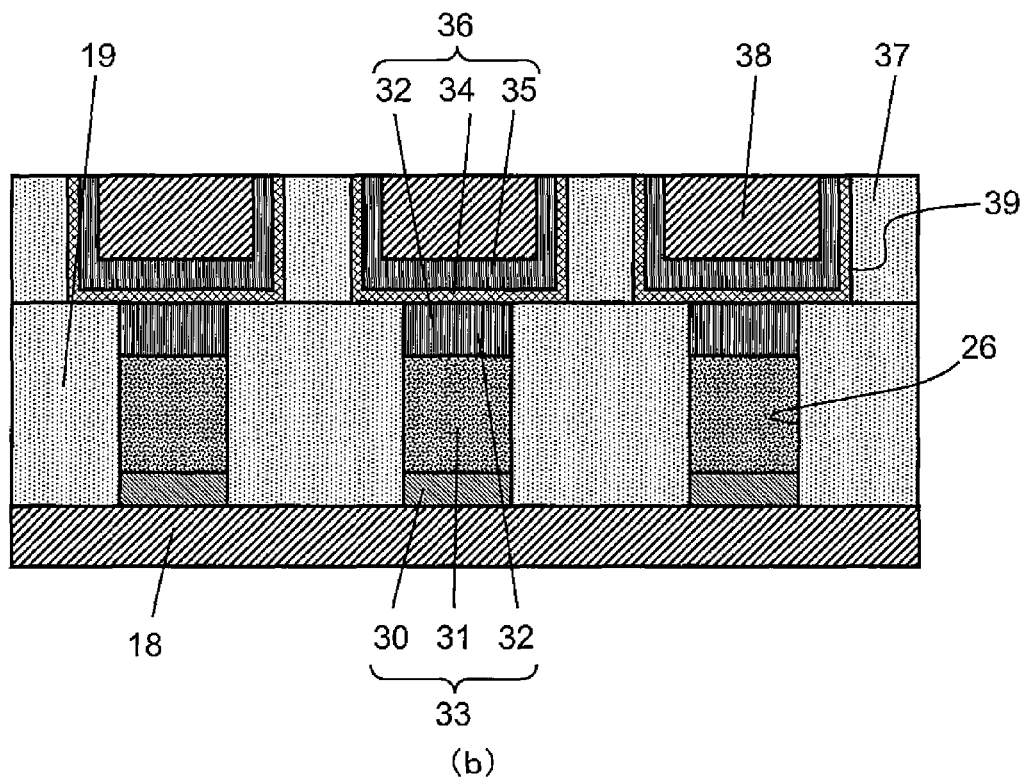

FIG. 8 is views showing configurations of a nonvolatile semiconductor memory device 200 according to Embodiment 2 of the present invention, in which FIG. 8(a) is a cross-sectional view and FIG. 8(b) is a cross-sectional view of partially enlarged major constituents showing a configuration of a memory section 33 and a diode element 36.

The nonvolatile semiconductor memory device 200 of this embodiment has basically the same configuration as that of the nonvolatile semiconductor memory device 100 of Embodiment 1 but is different from the same in that the nonvolatile semiconductor memory device 200 includes the diode element 36 connected in series with the memory section 33, and a precious metal electrode layer 30 is formed inside the contact hole in the nonvolatile semiconductor memory device 200.

To be specific, the precious metal electrode layer 30, a resistance variable layer 31, and an intermediate electrode 32 are stacked in this order inside each of the contact holes 26. The precious metal electrode layer 30, the resistance variable layer 31, and the intermediate electrode 32 constitute the memory section 33. The precious metal electrode layer 30 is formed of the same material as that of the precious metal electrode layer 20 of Embodiment 1. The resistance variable material 31 is formed of the same material as that of the resistance variable layer 21 of Embodiment 1. As the intermediate electrode 32, for example, TaN, TiN or W is used. The intermediate electrode layer 32 serves as one electrode of the diode element 36. These materials meet requirements of the material of this electrode.

A wire trench 39 is formed in an interlayer insulating layer 37 formed over the interlayer insulating layer 19. Inside the wire trench 39, the semiconductor layer 34, an upper electrode 35 and a copper wire 38 are stacked in this order. The intermediate electrode 32, the semiconductor layer 34 and the upper electrode 35 constitute a MSM diode which is an example of the diode element 36. As the diode element 36, an element having a non-linear switching characteristic, for example, a MSM diode having a stacked-layer structure of three layers which are a semiconductor layer and metal electrode layers sandwiching this semiconductor layer, a MIM diode having a stacked-layer structure of three layers which are an insulator layer and metal electrode layers sandwiching this insulator layer, a pn-junction diode having a stacked-layer structure of two layers which are a p-type semiconductor and a n-type semiconductor, or a Schottky diode having a stacked-layer structure of two layers which are a semiconductor layer and a metal electrode layer may be used, according to a resistance changing characteristic of a memory section.

By connecting the diode element in series with the resistance variable layer in the cross-point ReRAM, cross talk could be lessened when writing and reading resistance values to and from resistance variable layers formed at cross-points of lower wires (e.g., bit lines) and upper wires (e.g., word lines).

Next, a manufacturing method of this embodiment will be described with reference to FIGS. 9 to 12. In FIGS. 9 to 12, only constituents above the interlayer insulating layer 16 are depicted for simple illustration.

Figure 9:
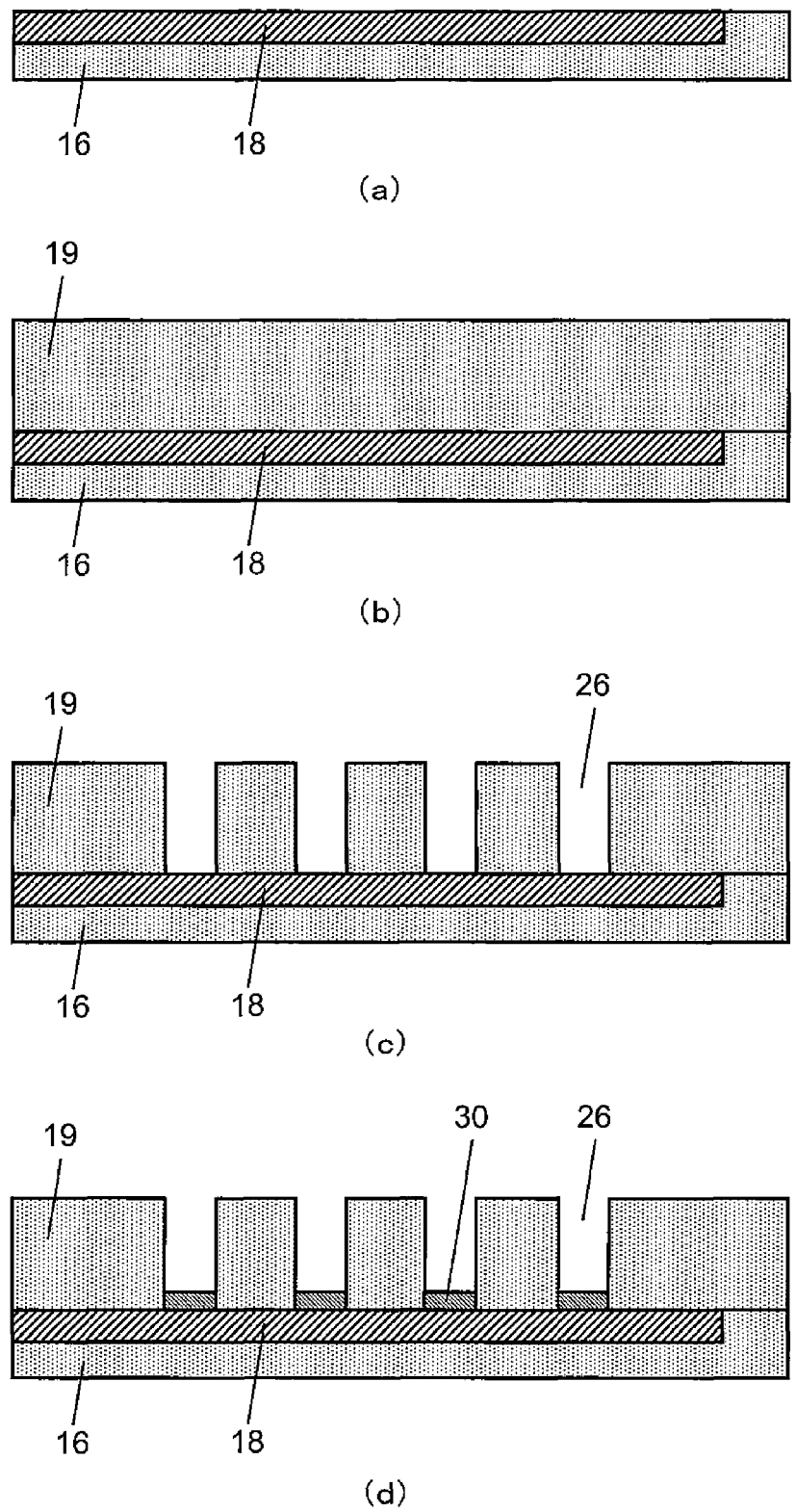
FIGS. 9(a) to 9(d) are views showing steps from a step of forming lower copper wires in stripe shape in a semiconductor interlayer insulating layer, a step of forming an interlayer insulating layer over the lower copper wires, a step of forming contact holes, to a step of forming precious metal electrode layers in bottom portions of the contact holes, respectively, in the manufacturing method of the nonvolatile semiconductor memory device according to Embodiment 2 of the present invention.

FIG. 9 is views showing steps from a step of forming the plurality of lower copper wires 18 in stripe shape by a damascene process, step of forming the interlayer insulating layer 19 over the lower copper wires 18, forming the contact holes 26 in the interlayer insulating layer 19, to a step of forming the precious metal electrode layers 30 on the lower copper wires 18 exposed in bottom portions of the contact holes 26, respectively. FIG. 9(a) is a cross-sectional view showing a state where the lower copper wires 18 are formed in stripe shape in the interlayer insulating layer 16. FIG. 9(b) is a cross-sectional view showing a state where the interlayer insulating layer 19 is formed on the insulating layer 16 including the lower copper wires 18. FIG. 9(c) is a cross-sectional view showing a state where the contact holes 26 connected to the lower copper wires 18, respectively, are formed using dry etching. FIG. 9(d) is a cross-sectional view showing a state where the precious metal electrode layers 20 are formed on the lower copper wires 18 exposed in bottom portions of the contact holes 26, respectively, by selective growth plating.

Initially, in the step of FIG. 9(a), the plurality of lower copper wires 18 are formed in stripe shape in the interlayer insulating layer 16 (step A). Then, as shown in FIG. 9(b), the interlayer insulating layer 19 comprising TEOS-SiO or the like is formed by CVD or the like (step B1'). In this case, to allow the contact holes 26 to be formed easily in the interlayer insulating layer 19, the interlayer insulating layer 19 may be formed into a stacked-layer structure composed of a plurality of layers in such a manner that SiN, SiON, SiCN, or the like serving as an etching stopper layer is formed as a lower layer of the interlayer insulating layer 19. In a further alternative, a material such as SiON, having a higher resistance to CMP than TEOS-SiO$_2$ may be formed as an upper layer of the interlayer insulating layer 19. By forming SiON as the upper layer of the interlayer insulating layer 19, CMP performed when the resistance variable layer 31 and the intermediate electrode 32 are filled into the contact hole 26 later can be carried out easily and surely.

In the step of FIG. 9(c), the plurality of contact holes 26 are formed to penetrate the interlayer insulating layer 19 to the surfaces of the respective lower copper wires 18, respectively (step B2'). In this embodiment, the contact holes 26 are formed at constant arrangement pitches along a lengthwise direction of each lower copper wire 18. The contact hole 26 has a smaller outer shape than a width of the lower copper wire 18, which is similar to the shape described with reference to FIGS. 5 to 7 in Embodiment 1.

In the step of FIG. 9(d), the precious metal electrode layers 30 are formed on the lower copper wires 18 exposed in bottom portions of the contact holes 26, respectively, by electroless selective growth plating (step B3'). In this embodiment, platinum (Pt) is used as the precious metal electrode, and as electroless Pt plating solution, hydrazine-ammonia Pt plating solution, or Pt plating solution containing as a reducing agent boron compound or hypophosphorous acid may be used. The layer thickness of the Pt electrode layer may be set to not less than 5 nm and not more than 24 nm. By thinning the Pt electrode layer so that the layer thickness falls within this range, generation of hillocks of Pt due to thermal treatment can be suppressed and an interface between the resistance variable layer and the Pt electrode layer can be plararized. By conducting the above Pt electroless plating after forming an electrode seed layer containing one of nickel, nickel-phosphorus alloy, or nickel-boron alloy, on the lower copper wire 18, Pt can be selectively grown on Cu more efficiently. Alternatively, the electrode seed layer may have a stacked-layer structure of a combination of palladium and nickel, a combination of palladium and nickel-phosphorus alloy, or a combination of palladium and nickel-boron alloy. In this embodiment, also, the precious metal electrode layer 30 may be formed by electroless selective plating using palladium (Pd) as the precious metal electrode.

By using the electroless selective growth plating, precious metal is selectively deposited only on the lower copper wire which is a conductor, and is not deposited on a contact hole side wall defined by the interlayer insulating layer. If the electrode material is deposited on the contact hole side wall, a current leak would occur between upper and lower wires because of the electrode deposited on the side wall. However, by using the electroless selective growth plating, such a side wall current leak is prevented.

Since the precious metal electrode is deposited only in the bottom portion of the contact hole and is not deposited on the interlayer insulating layer, a step of removing the electrode material deposited over the interlayer insulating layer by CMP or etch back, is omitted. In particular, it is difficult to remove the precious metal by CMP because of its low reactivity. By using the electroless selective growth plating, the number of process steps can be reduced because of omission of the damascene process by CMP. In addition, the precious metal can be deposited only in the bottom portion of the contact hole and is not formed in regions on which the precious metal should not be deposited. This results in a good cost performance.

Figure 10:
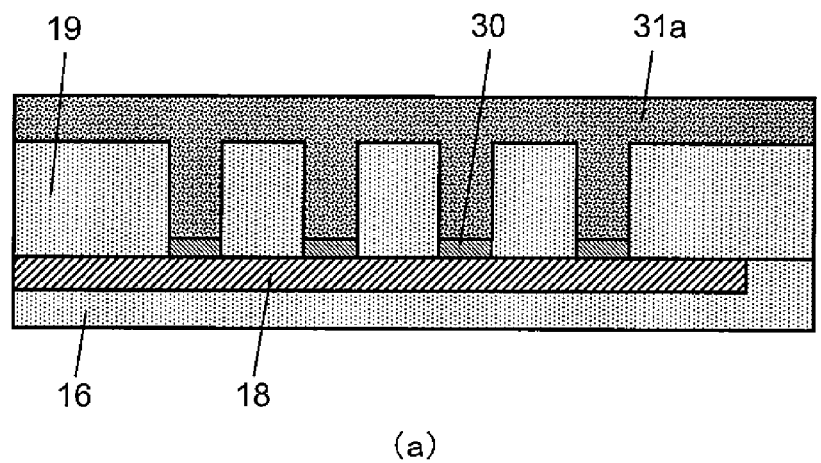
FIGS. 10(a) to 10(c) are views showing a step of filling the resistance variable layer into the contact hole, respectively, in the manufacturing method of the nonvolatile semiconductor memory device according to Embodiment 2 of the present invention.
Figure 10:
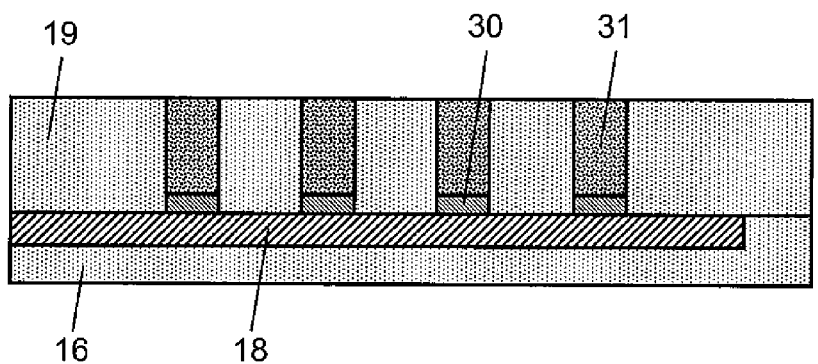
Figure 10:
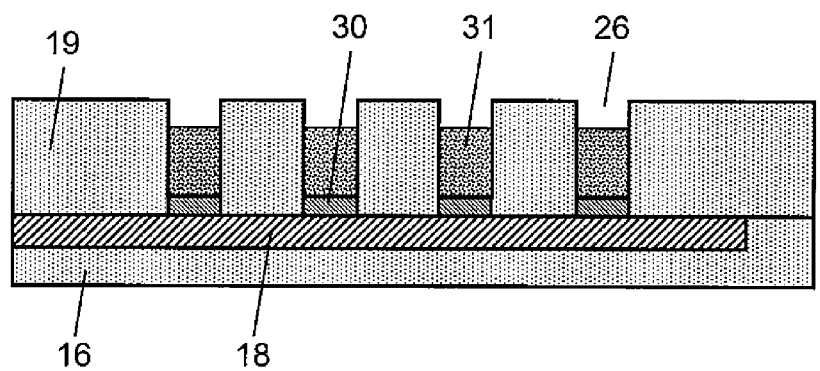

FIG. 10 is views showing steps of filling the resistance variable layer 31 into the contact hole 26. FIG. 10(a) is a cross-sectional view showing a state where a resistance variable thin layer 31a which becomes the resistance variable layer 31 is formed over the interlayer insulating layer 19 including the contact hole 26. FIG. 10(b) is a cross-sectional view showing a state where the resistance variable thin layer 31a over the interlayer insulating layer 19 is removed by CMP. FIG. 10(c) is a cross-sectional view showing a state where the resistance variable layer 31 inside the contact hole 26 is over-polished to form a recess at upper side thereof.

In the step of FIG. 10(a), the resistance variable thin layer 31a which becomes the resistance variable layer 31 is formed over the interlayer insulating layer 19 including the contact hole 26. In this embodiment, as the resistance variable thin layer 31a, oxygen-deficient Ta oxide (TaO$_x$) is used.

Then, in step of FIG. 10(b), the resistance variable thin layer 31a over the interlayer insulating layer 19 is removed by CMP. In this way, the resistance variable layers 31 are filled into the contact holes 26 to be provided on the precious metal electrodes 30 inside the contact holes 26, respectively (step C). Instead of CMP, etch back may be used to remove the resistance variable thin layer 31a over the interlayer insulating layer 19, and to fill the resistance variable layer 31 into the contact hole 26.

In the step of FIG. 10(c), upper portion of the resistance variable layer 31 inside the contact hole 26 is removed by over polishing. Instead of over polishing, the upper portion of the resistance variable layer 31 may be removed by etch back.

Figure 11:
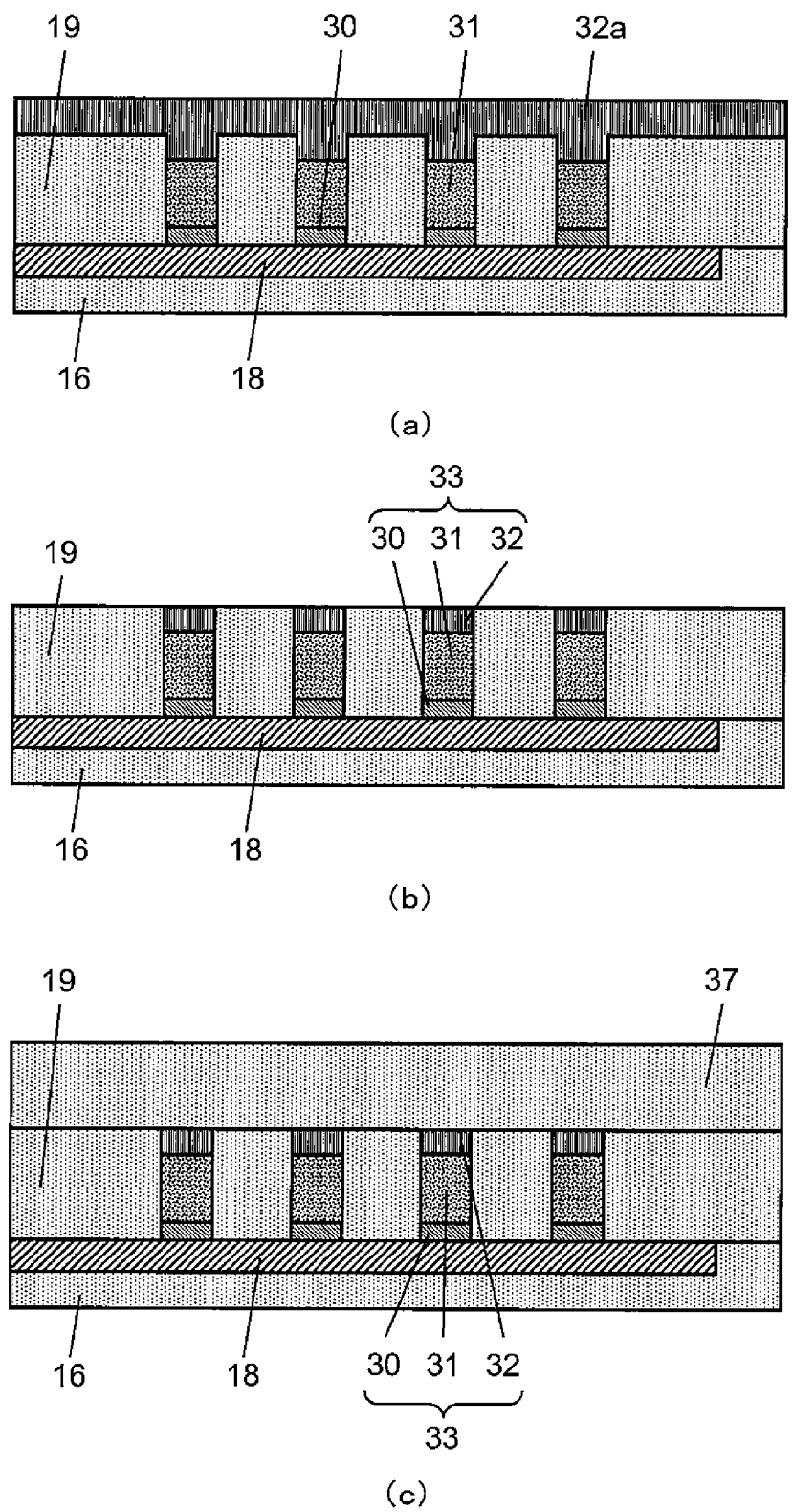
FIGS. 11(a) to 11(c) are cross-sectional views showing steps from a step of filling an intermediate electrode into the contact hole such that the intermediate electrode is provided on the resistance variable layer inside the contact hole, to a step of forming the interlayer insulating layer on the intermediate electrode, in the manufacturing method of the nonvolatile semiconductor memory device according to Embodiment 2 of the present invention.
Figure 12:
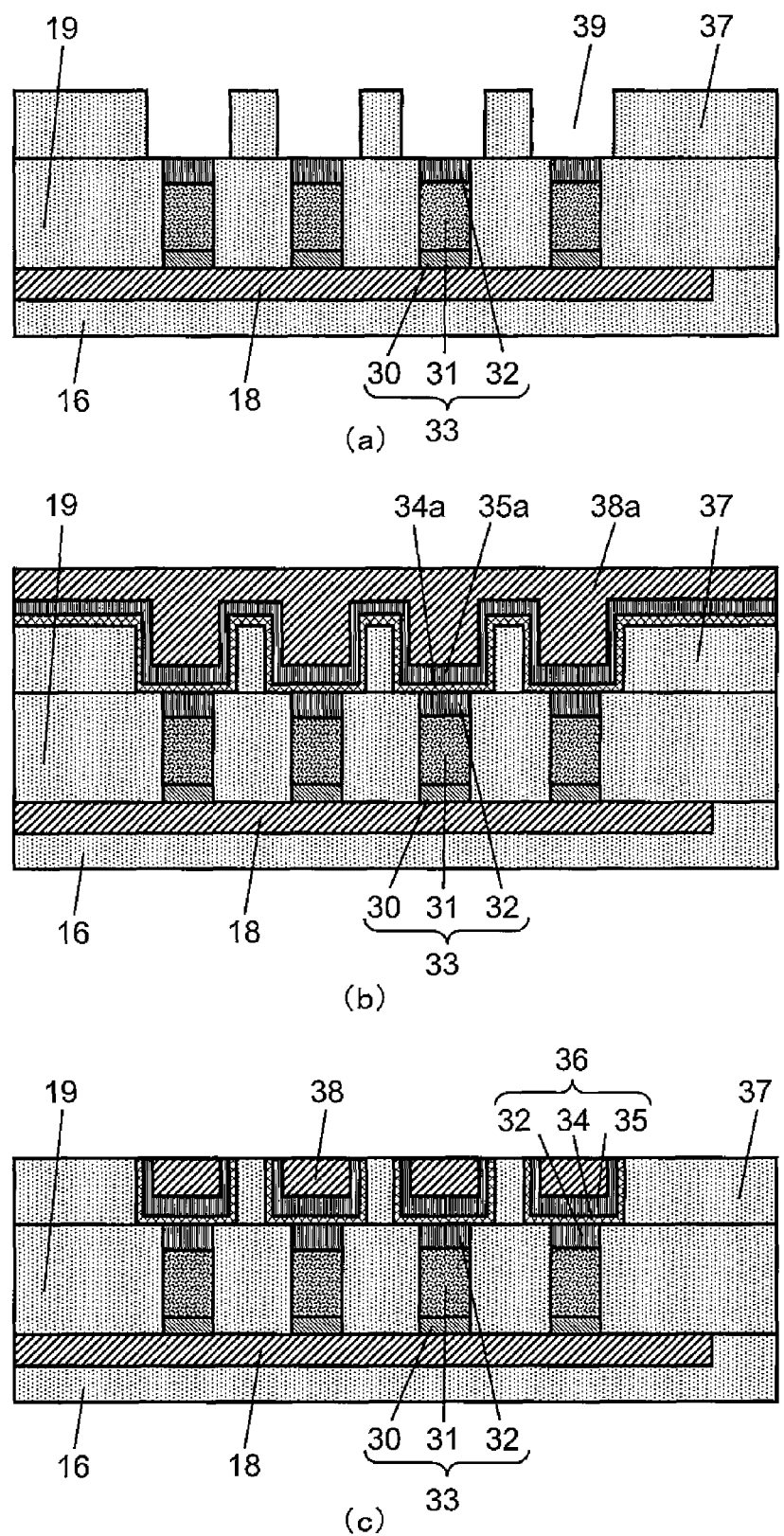
FIGS. 12(a) to 12(c) are cross-sectional views showing steps from a step of forming a wire trench in the interlayer insulating layer to a step of filling a diode element and an upper copper wire into the wire trench, in the manufacturing method of the nonvolatile semiconductor memory device according to Embodiment 2 of the present invention.

FIG. 11 is views showing steps from a step of forming the intermediate electrode 32 which becomes an upper electrode of the memory section 33 and a lower electrode of the diode element 36 on the resistance variable layer 31 inside the contact hole 26, to a step of forming an interlayer insulating layer 37 on the intermediate electrode 32. FIG. 11(a) is a cross-sectional view showing a state where an electrode thin layer 32a which becomes the intermediate electrode 32 serving as the upper electrode of the memory section and the lower electrode of the diode element 36 on the interlayer insulating layer 19 including the contact hole 26. FIG. 11(b) is a cross-sectional view showing a state where the electrode thin layer 32a over the interlayer insulating layer 19 is removed by CMP. FIG. 11(c) is a cross-sectional view showing a state where an interlayer insulating layer 37 is formed over the interlayer insulating layer 19 including the intermediate electrode 32.

In the step of FIG. 11(a), the electrode thin layer 32a which becomes the intermediate electrode 32 serving as the upper electrode of the memory sections 33 and the lower electrode of the diode element 36 is formed over the intermediate insulating layer 19 including the contact hole 26. In this embodiment, as the electrode thin layer 32a, a layer comprising TaN, TiN, or W is deposited by sputtering.

Then, as shown in FIG. 11(b), the electrode thin layer 32a over the interlayer insulating layer 19 is removed by CMP, to fill the intermediate electrode 32 into the contact hole 26.

Then, as shown in FIG. 11(c), further, the interlayer insulating layer 37 is formed over the interlayer insulating layer 19 including the intermediate electrode 32, by CVD or the like.

In the step of FIG. 12(a), a wire trench 39 is formed in the interlayer insulating layer 37 so that a semiconductor layer 34 and an upper electrode 35 which become a part of the diode element 36, and further an upper copper wire 38, will be filled into the wire trench 39. In this embodiment, the wire trenches 39 are formed in stripe shape to cross the lower copper wires 18, respectively, thereby forming the semiconductor layers 34, the upper electrodes 35, and the upper copper wires 38 in stripe shape such that the semiconductor layers 34, the upper electrodes 35, and the upper copper wires 38 cross the lower copper wires 18, respectively.

Then, in the step of FIG. 12(b), a semiconductor thin layer 34a which becomes the semiconductor layers 34 of the diode elements 36, a metal thin layer 35a which becomes the upper electrodes 31 of the diode elements 36, and further, a copper thin layer 38a which becomes the upper copper wires 38, are stacked over the interlayer insulating layer 37 including the wire trenches 39 (step D, step E).

In this embodiment, using nitrogen-deficient silicon nitride ($SiN_x$) as a material of the semiconductor layer 34 and TaN, TiN or W as a material of the upper electrode 35, the MSM diode is formed by the semiconductor layer 34, the intermediate electrode 32 and the upper electrode 35 such that the semiconductor layer 34 is sandwiched between the intermediate electrode 32 and the upper electrode 35. A $SiN_x$ layer having such a semiconductive characteristic may be deposited by, for example, reactive sputtering in nitrogen gas atmosphere using a Si target. For example, this may be deposited under conditions of, for example, chamber pressure of 0.1 Pa~1 Pa and $Ar/N_2$ flow rate of 18 sccm/2 sccm.

When the $SiN_x$ layer having such a semiconductive characteristic is deposited in a 16 nm-thickness under the above conditions, a current density of $2.5 \times 10^3$ $A/cm^2$ is obtained by applying a voltage of 1.6V, while a current density of $5 \times 10^2$ $A/cm^2$ is obtained by applying a voltage of 0.8V. When these voltages are used as a reference, an ON/OFF ratio is 5. Thus, a diode element including such a $SiN_x$ layer can be used satisfactorily as a diode element of a nonvolatile semiconductor memory device.

The upper copper wire 38 may be formed of the same material as that of the lower copper wire 18.

Then, in the step of FIG. 12(c), the semiconductor thin layer 34a, the metal thin layer 35a and the copper thin layer 38a on the interlayer insulating layer 37 are removed by CMP, thereby filling the semiconductor layer 34 and the upper electrode 35 of the diode element 36, and the upper copper wire 38 into the wire trench 39. The upper copper wire 38 is electrically connected to the resistance variable layer 31 via the upper electrode 35, the semiconductor layer 34 and the intermediate electrode 32.

Through the above steps, the memory section 33 is formed by the precious metal electrode 30, the resistance variable layer 31 and the intermediate electrode 32, while the diode element 36 is formed by the intermediate electrode 32, the semiconductor layer 34 and the upper electrode 35. In this manner, the nonvolatile semiconductive memory device 200 can be manufactured according to the manufacturing method of this embodiment.

Although in this embodiment, an example in which the intermediate electrode 32 is formed at upper side of the resistance variable layer 31 inside the contact hole to implement the optimal lower electrode of the diode has been described, the diode material 34 may be directly formed at the upper side of the resistance variable layer 31 depending on a combination of a material of the resistance variable layer and a material of the diode.

Although the MSM diode is used as the diode element in this embodiment, a MIM diode having a stacked-layer structure of three layers which are an insulator layer and metal electrode layers sandwiching the insulator layer, a pn-junction diode having a stacked-layer structure of two layers which are a p-type semiconductor layer and a n-type semiconductor layer, or a Schottky diode having a stacked-layer structure of two layers which are a semiconductor layer and a metal electrode layer may be used.

Embodiment 3

Figure 13:
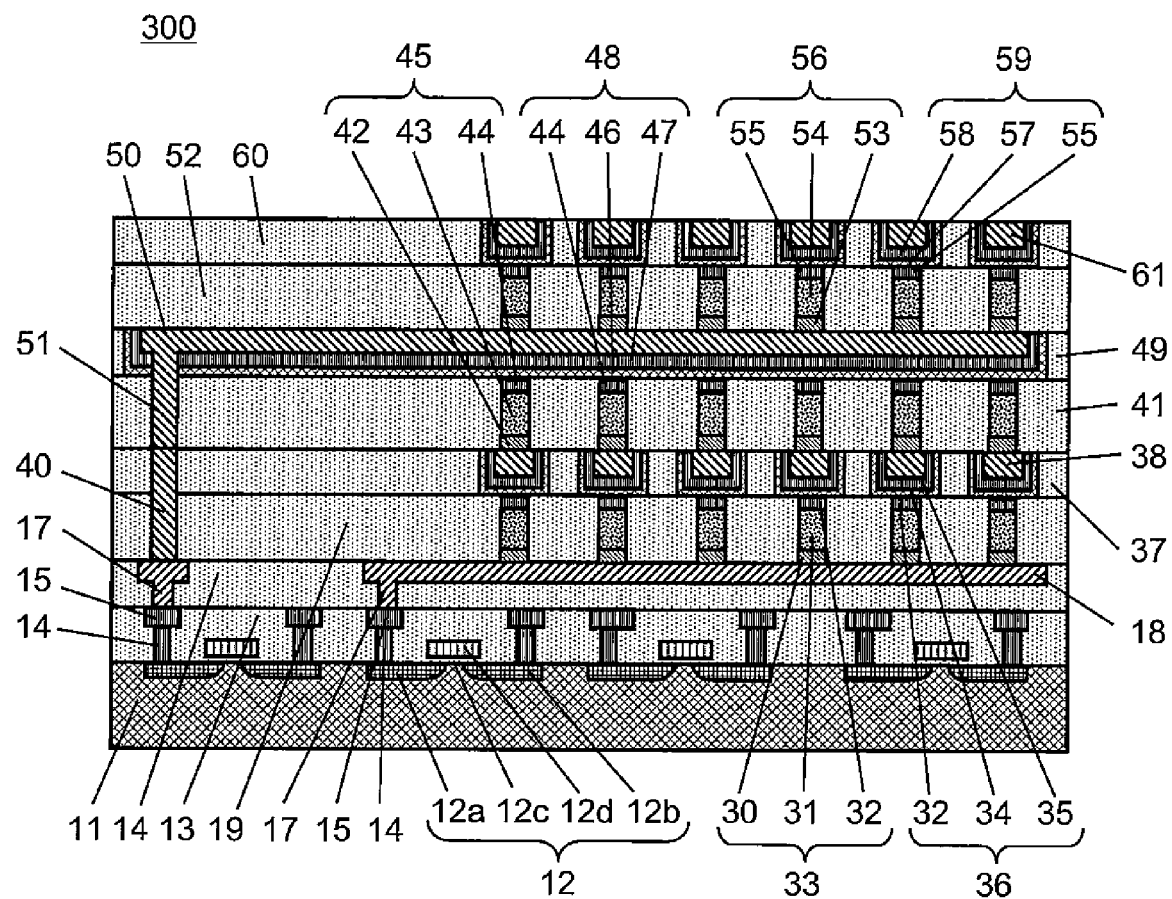
FIG. 13 is a cross-sectional view showing a configuration of a nonvolatile semiconductor memory device according to Embodiment 3 of the present invention.

FIG. 13 is a cross-sectional view showing a configuration of a nonvolatile semiconductor memory device 300 according to Embodiment 3 of the present invention. The nonvolatile semiconductor memory device 300 has a configuration, in which two layers each consisting of a constituent unit including an interlayer insulating layer, and a memory section, and a diode element which are filled into a contact hole in the interlayer insulating layer, and an upper copper wire are stacked on a basic constituent of the nonvolatile semiconductor memory device 200 according to Embodiment 2 shown in FIG. 8. By stacking the layers in this way, a larger-capacity nonvolatile semiconductor memory device is attained.

Hereinafter, the configuration of the nonvolatile semiconductor memory device 300 of this embodiment will be described in brief. Since three layers of the memory section and three layers of the diode element are stacked, first, second and third are assigned to names of the constituents in the first layer, the second layer and the third layer, respectively, to distinguish between them, for easier understanding of each of the constituents in the first layer, the second layer and the third layer.

Over the interlayer insulating layer 37 including the first upper copper wire 38, an interlayer insulating layer 41 is further formed. Contact holes are formed in the interlayer insulating layer 41 in locations respectively corresponding to the first memory sections 33, respectively. A second precious metal electrode layer 42, a second resistance variable layer 43, and an intermediate electrode 44 serving as an upper electrode of a second memory section 45 and a lower electrode of a second diode element 48 are filled into each contact hole. An interlayer insulating layer 49 is formed over the interlayer insulating layer 41 including the intermediate electrode 44, to allow the second diode element 48 and second upper Cu wire 50 to be embedded thereinto. A second semiconductor layer 46 and second upper electrode 47 of the second diode element 48, and the second upper Cu wire 50 are formed in stripe shape to cross the first upper Cu wire, respectively, and are embedded in the interlayer insulating layer 49 such that they are connected to the corresponding second intermediate electrode 44.

Then, an interlayer insulating layer 52 is formed over the interlayer insulating layer 49 including the second upper Cu wire. Contact holes are formed in the interlayer insulating layer 52 in locations respectively corresponding to the first memory sections 33 and the second memory sections 45, respectively. A third precious metal electrode layer 53, a third resistance variable layer 54 and a third intermediate electrode 55 are filled into the corresponding contact hole.

An interlayer insulating layer 60 is formed over the interlayer insulating layer 52 including the third intermediate electrode 55. A third semiconductor layer 57 and a third upper electrode 58 of the third diode element 59, and a third upper Cu wire 61 are formed in stripe shape to cross the second upper Cu wire, respectively, and are embedded in the interlayer insulating layer 60 such that they are connected to the corresponding third intermediate electrode 55.

The second memory section 45 is constituted by the second precious metal electrode layer 42, the second resistance variable layer 43, and the second intermediate electrode 44. The second diode element 48 is constituted by the second intermediate electrode 44, the second semiconductor layer 46 and the second upper electrode 47. The third memory section 56 is constituted by the third precious metal electrode layer 53, the third resistance variable layer 54 and the third intermediate electrode 55. The third diode element 59 is constituted by the third intermediate electrode 55, the third semiconductor layer 57 and the third upper electrode 58.

The lower copper wire 18 is connected to the source region 12a of the active element 12 via the embedded conductors 14 and 17 and the semiconductor electrode wire 15. Likewise, the first upper copper wire 38 is connected to another active element (not shown) via embedded conductors (not shown) and a semiconductor electrode wire (not shown). As shown in FIG. 13, the second upper copper wire 50 is connected to the source region 12a of another active element 12 via the embedded conductors 14, 17, 40 and 51 and the semiconductor electrode wire 15. The third upper copper wire 61 is connected to another active element (not shown) via embedded conductors (not shown) and a semiconductor electrode wire (not shown) like the first upper copper wire 38.

The first lower copper wire 18 and the first upper copper wire 38 in the first layer serve as either one of a bit line and a word line, while the first upper wire 38 and the second upper copper wire 50 serve as one of the bit line and the word line in the same manner. When the first upper copper wire 38 constitutes the bit line in the first layer, it constitutes the bit line in the second layer, too, and the second upper copper wire 50 constitutes the word line. When the second upper copper wire 50 constitutes the word line, the third upper copper wire 51 constitutes the bit line.

As described above, in the nonvolatile semiconductor memory device 300 of this embodiment, since the diode elements 36, 48 and 59 are provided individually respectively for the memory sections 33, 45 and 56 provided in respective layers, it is possible to write and read data to and from the memory sections 33, 45 and 56 provided in respective layers, stably and surely.

Manufacturing process steps of the nonvolatile semiconductor memory device 300 including the memory sections and the diode elements provided in multi-layered structure including two or more layers are substantially implemented by repeating the above explained manufacturing process steps of the nonvolatile semiconductor memory device 200 of Embodiment 2.

Embodiment 4

Figure 14:
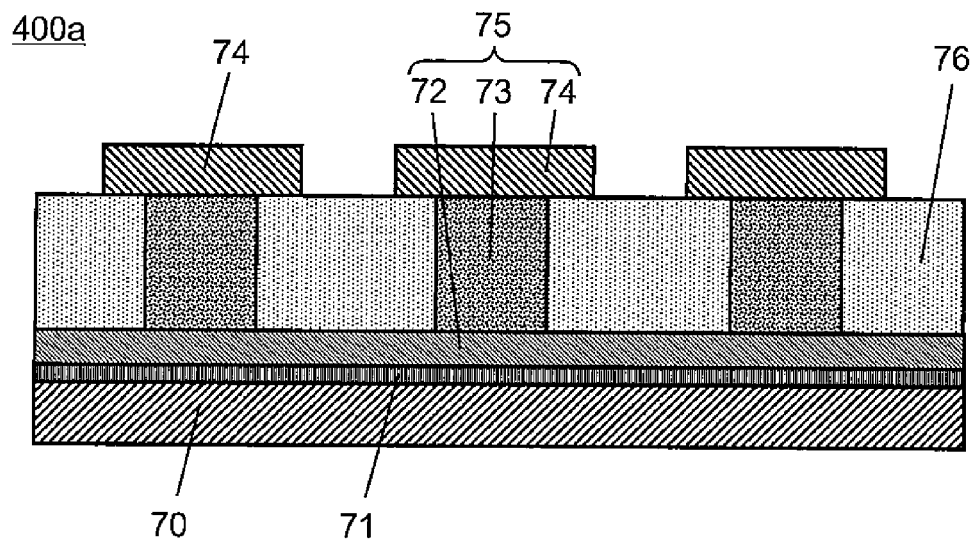
FIGS. 14(a) and 14(b) are cross-sectional views of major constituents showing a configuration of a memory section in a nonvolatile semiconductor memory device according to Embodiment 4 of the present invention.
Figure 14:
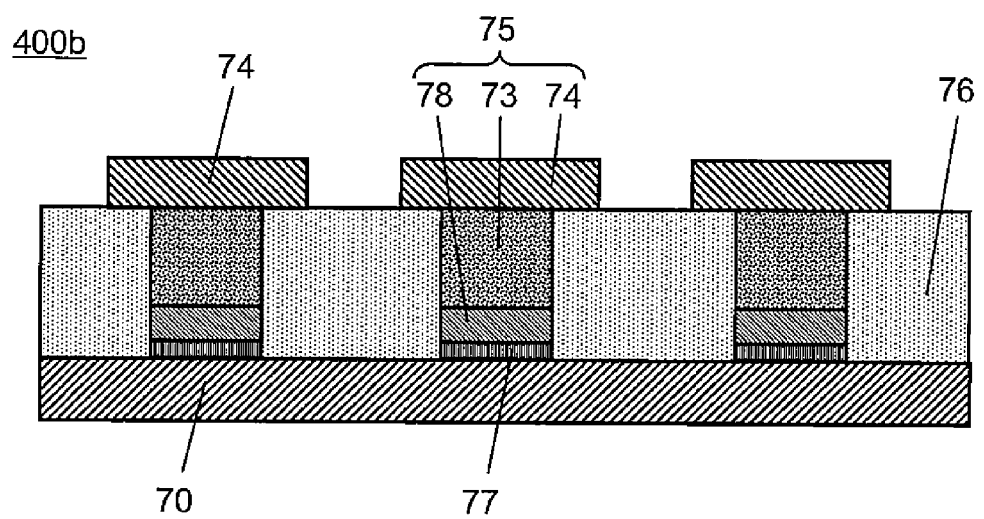

FIG. 14 is cross-sectional views showing configurations of a nonvolatile semiconductor memory device according to Embodiment 4 of the present invention. A nonvolatile semiconductor memory device 400a of FIG. 14(a) has basically the same configuration as that of the nonvolatile semiconductor memory device 100 according to Embodiment 1 shown in FIGS. 1 and 2, but is different from the same in that an electrode seed layer 71 is provided to underlie a precious metal electrode layer 72 in the nonvolatile semiconductor memory device 400a. The electrode seed layer 71 may have a stacked-layer structure of two or more layers. For example, the electrode seed layer 71 for the precious metal electrode layer 72 comprising platinum may have a stacked-layer structure of a nickel layer and a nickel-boron alloy layer, or a stacked-layer structure of palladium and a nickel-boron alloy. The electrode seed layer 71 is formed by electroless plating on copper. The reason why the electrode seed layer 71 is provided is that precious metal is deposited effectively by electroless plating by providing the electrode seed layer 71 such as the nickel layer which is catalytically active to hypophosphorous acid, in a case where the precious metal electrode layer 72 is formed by electroless selective growth plating and hypophosphorous acid is used as a reducing agent contained in a plating solution.

In a nonvolatile semiconductor memory device 400b of FIG. 14(b), like the memory section 33 of the nonvolatile semiconductor memory device 200 according to Embodiment 2 shown in FIG. 8, a precious metal electrode layer 78 and a resistance variable layer 73 which constitute a part of a memory section 75 are formed in a bottom portion inside a contact hole in an interlayer insulating layer 76. The nonvolatile semiconductor memory device 400b is different from the nonvolatile semiconductor memory device 200 in that an electrode seed layer 77 is provided on a lower copper wire 70 exposed in a bottom portion of the contact hole to underlie the precious metal electrode 78. Like the nonvolatile semiconductor memory device 400a, the provision of the electrode seed layer 77 allows a reducing agent of a precious metal plating solution to be selected more flexibly, when the precious metal electrode layer 78 is formed by electroless selective growth plating.

Embodiment 5

Figure 15:
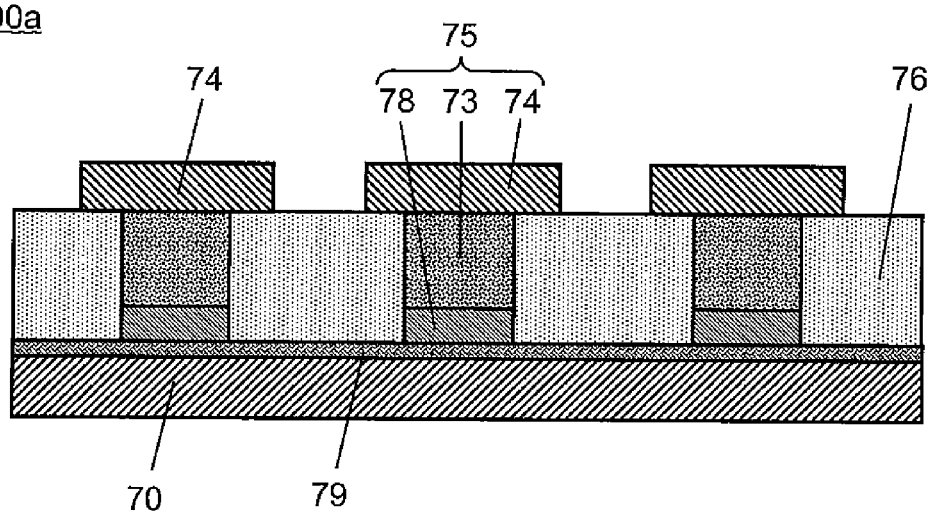
FIGS. 15(a) and 15(b) are cross-sectional views of major constituents showing a configuration of a memory section in a nonvolatile semiconductor memory device according to Embodiment 5 of the present invention.
Figure 15:
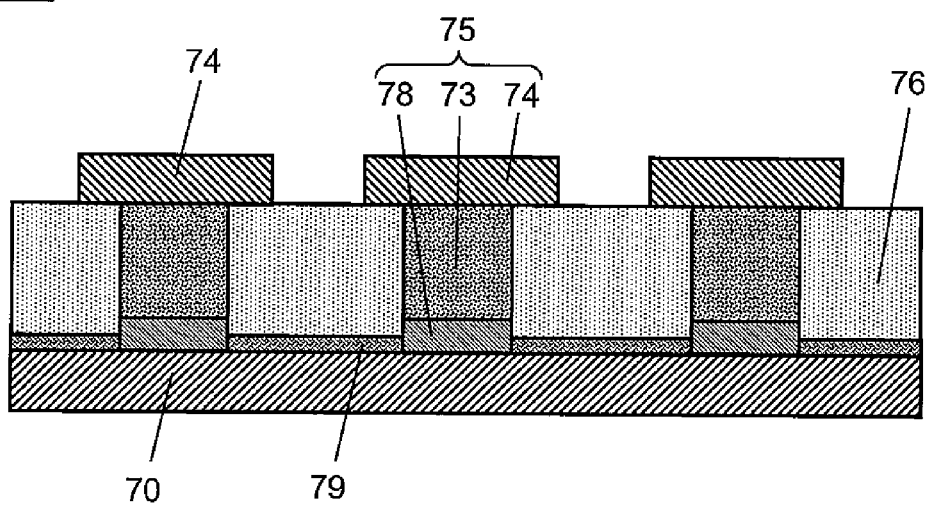

FIG. 15 is cross-sectional views showing configurations of a nonvolatile semiconductor memory device 500 according to Embodiment 5 of the present invention. A nonvolatile semiconductor memory device 500*a* of FIG. 15(*a*) has a structure of a combination of basic configurations of the nonvolatile semiconductor memory devices 400*a* and 400*b* shown in FIG. 14. The nonvolatile semiconductor memory device 500*a* has a feature that a top cap layer 79 is formed on the lower Cu wire 70 and the precious metal electrode layer 78 is formed in a bottom portion inside the contact hole such that it is located on the top cap layer 79.

Typically, the top cap layer 79 is formed on the lower Cu wire 70 to suppress Cu from diffusing from the lower Cu wire 70. As the top cap layer 79, CoWP, TiWN, TiN, Ti, Ta or TaN or a laminated layer of them may be used. The top cap layer 79 formed of such a material serves as a catalytic active layer of a plating solution when the precious metal electrode layer 78 is formed by electroless selective growth plating.

The nonvolatile semiconductor memory device 500*b* of FIG. 15(*b*) has basically substantially the same configuration as that of the nonvolatile semiconductor memory device 500*a* of FIG. 15(*a*) but is different from the same in that the contact hole penetrates the top cap layer 79 and is connected to the lower copper wire 70 in the nonvolatile semiconductor memory device 500*b*. When the precious metal electrode layer 78 is formed by electroless selective growth plating, a precious metal plating solution is sometimes catalytically inactive on a top cap layer depending on a kind of a reducing agent contained in the precious metal plating solution. To solve this, in this embodiment, the contact hole is formed to be connected to the lower copper wire 70 to expose copper in the bottom portion of the contact hole, and the precious metal electrode layer 78 is formed by electroless selective growth plating on the exposed copper. In this case, the top cap layer need not be electrically conductive, and therefore an insulative barrier layer such as SiN may be used as the top cap layer 79.

Embodiment 6

Figure 16:
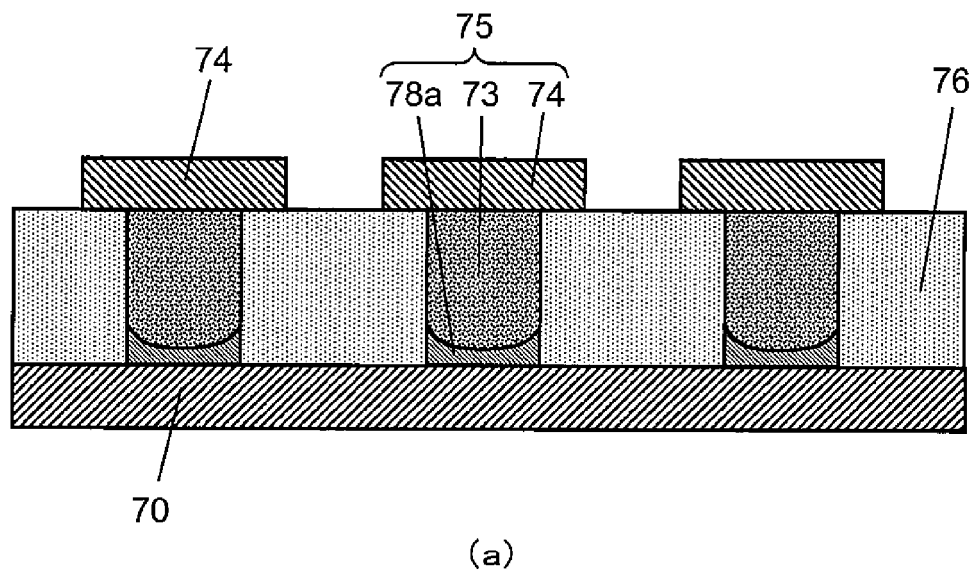
FIGS. 16(a) and 16(b) are cross-sectional views of major constituents showing a configuration of a memory section in a nonvolatile semiconductor memory device according to Embodiment 6 of the present invention.
Figure 16:
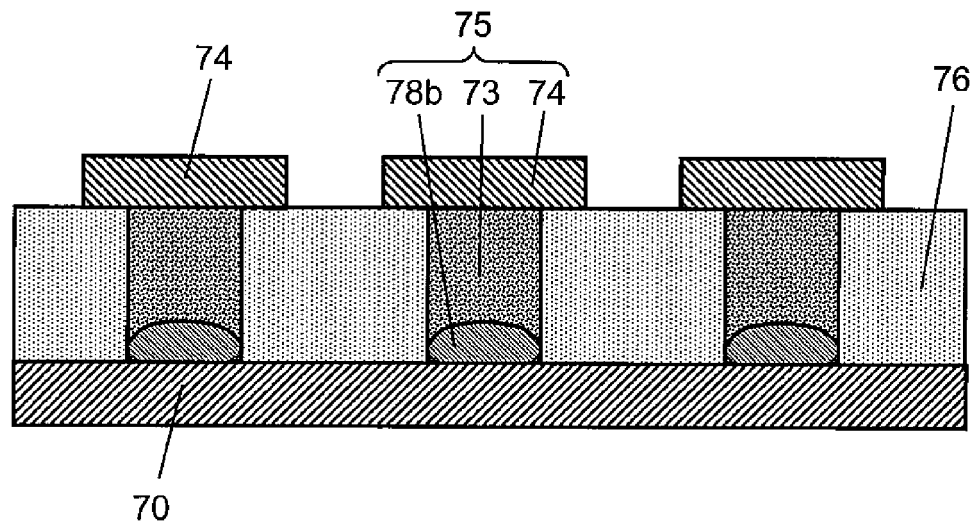

FIG. 16 is cross-sectional views showing configurations of a nonvolatile semiconductor memory device according to Embodiment 6 of the present invention. Memory sections of nonvolatile semiconductor memory devices 600*a* and 600*b* have basically the same configuration as that the memory section 33 of the nonvolatile semiconductor memory device 200 according to Embodiment 2 shown in FIG. 8, but is different from the same in that the precious metal electrode layer 78 of the nonvolatile semiconductor memory device 600*a* of FIG. 16(*a*) has a concave cross-sectional shape and the precious metal electrode layer 78 of the nonvolatile semiconductor memory device 600*b* of FIG. 16(*b*) has a convex cross-sectional shape. In either configuration, an area of an interface between the precious metal electrode layer 78 and the resistance variable layer 73 can be increased without increasing a size of the memory section. As a result, a stable resistance changing characteristic, a high yield, and high reliability are attainable.

When the precious metal electrode layer 78 is formed by electroless selective growth plating, a convex-concave shape of the precious metal electrode layer 78 is different depending on a difference in material, layer thickness, or crystalline growth property such as granular growth or columnar growth of the precious metal electrode. Besides, the cross-sectional shape of the precious metal electrode layer 78 is different whether the material used for the interlayer insulating layer 76 has a hydrophilic property or a hydrophobic property.

Embodiment 7

Figure 17:
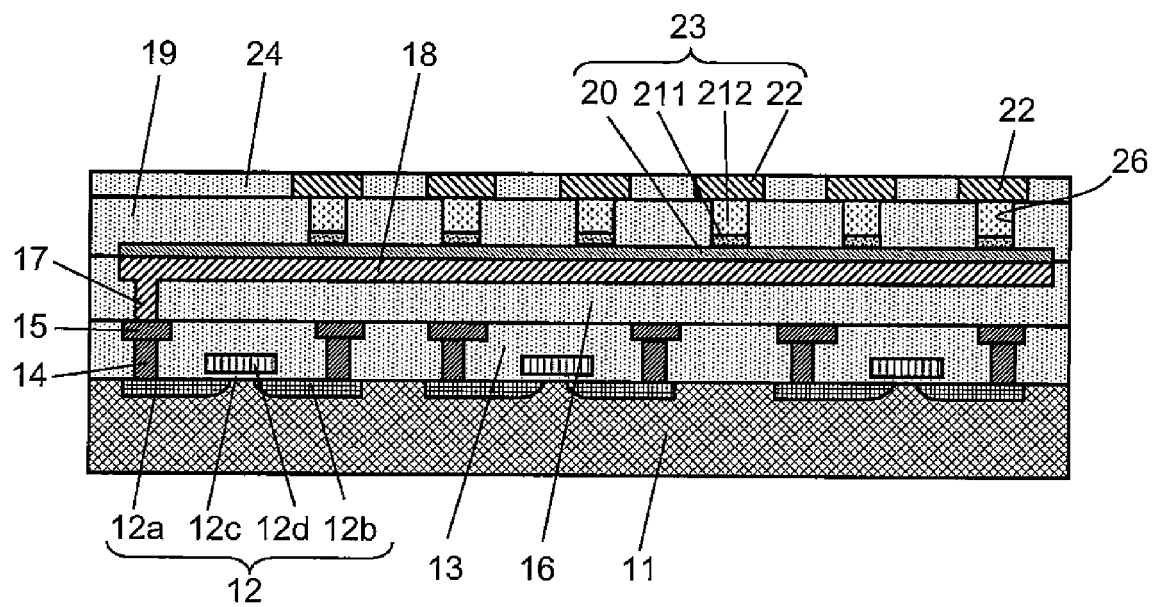
FIGS. 17(a) and 17(b) are cross-sectional views showing a configuration of a nonvolatile semiconductor memory device according to Embodiment 7 of the present invention.
Figure 17:
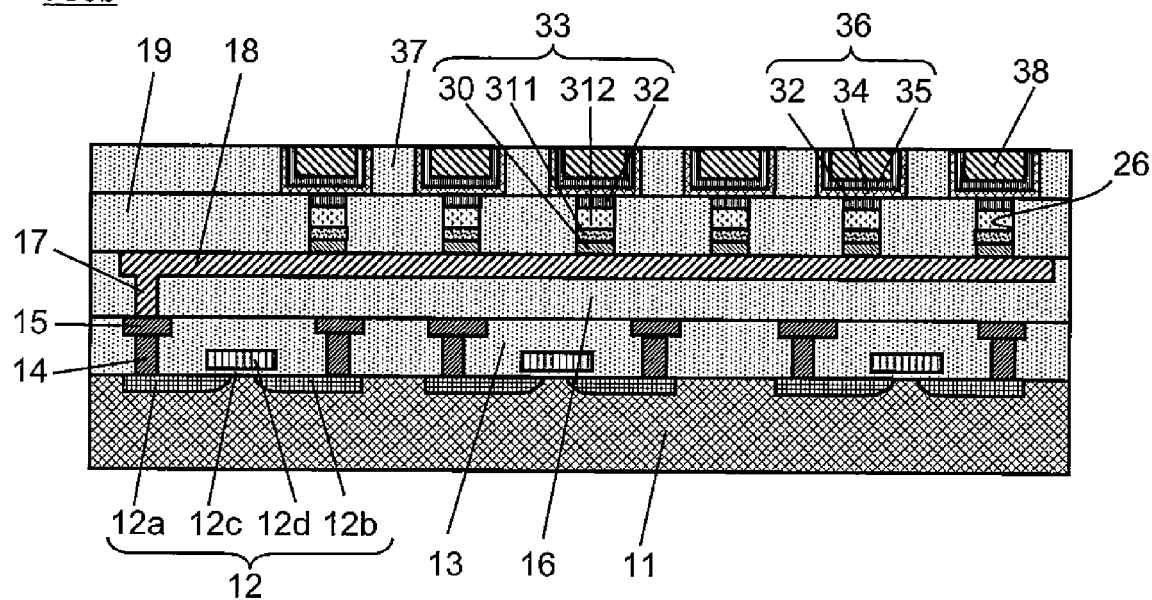

FIG. 17 is cross-sectional views showing configurations of a nonvolatile semiconductor memory device according to Embodiment 7 of the present invention. A nonvolatile semiconductor memory device 700*a* of FIG. 17(*a*) has a configuration in which the resistance variable layer 21 in the nonvolatile semiconductor memory device 100 of FIG. 1(*b*) includes a first resistance variable layer 211 and a second resistance variable layer 212 which are stacked together. To be more specific, the resistance variable layer in the nonvolatile semiconductor memory device 700*a* includes the first resistance variable layer 211 formed inside the contact hole 26 and connected to the precious metal electrode layer 20, and the second resistance variable layer 212 formed inside the contact hole 26 and formed on the first resistance variable layer 211. The first resistance variable layer 211 and the second resistance variable layer 212 comprise metal oxide of the same kind (oxygen-deficient transition metal oxide). The first resistance variable layer 211 has a higher oxygen content than the second resistance variable layer 212.

A nonvolatile semiconductor memory device 700*b* of FIG. 17(*b*) has a configuration in which the resistance variable layer 31 in the nonvolatile semiconductor memory device 200 of FIG. 8(*a*) includes a first resistance variable layer 311 and a second resistance variable layer 312 which are stacked together. To be more specific, the resistance variable layer in the nonvolatile semiconductor memory device 700*b* includes the first resistance variable layer 311 formed inside the contact hole 26 and connected to the precious metal electrode layer 30, and the second resistance variable layer 312 formed inside the contact hole 26 and located on the first resistance variable layer 311. The first resistance variable layer 311 and the second resistance variable layer 312 comprise metal oxide of the same kind (oxygen-deficient transition metal oxide). The first resistance variable layer 311 has a higher oxygen content than the second resistance variable layer 312.

In the above configuration, a resistance variable element can be filled into a hole structure suitable for a miniaturized configuration. Therefore, a resistance variable nonvolatile memory device adapted for a larger capacity and higher-dense integration is implemented. Since the first resistance variable layers 211 and 311 with higher oxygen contents are disposed in bottom portions of the contact holes 26 such that they are connected to the precious metal electrode layers 20 and 30, respectively, and the second resistance variable layers 212 and 312 with lower oxygen contents are disposed on the first resistance variable layers 211 and 311, respectively, resistance change is allowed to occur surely at an interface region of each of the precious metal electrode layers 20 and 30, and a polarity with which the resistance change occurs is stabilized, thereby resulting in a stable memory characteristic. This is because, in a mechanism of a resistance changing operation, redox of oxygen in the vicinity of an electrode interface is dominant, and the resistance changing operation occurs preferentially at an interface region where there is a large quantity of oxygen which contributes to the redox.

Selective growth plating is suitably used to form the first resistance variable layers 211 and 311 and the second resistance variable layers 212 and 312 into the contact holes 26. To be specific, metal (in this embodiment, tantalum) is selectively grown only on each of the precious metal electrode layers 20 and 30 exposed in the bottom portion of the contact hole 26. Firstly, this metal is oxidized in oxygen atmosphere (400 degrees C.~450 degrees C.) to form each of the first resistance variable layers 211 and 311 comprising tantalum oxide. In this case, tantalum is perfectly oxidized, and therefore, its oxygen content is approximately 72 atm % which is close to a stoichiometry (stoichiometric composition) of Ta$_2$O$_5$. It should be noted that in this step, high-efficient thermal oxidization is suitably used to perfectly oxidize the metal into a metal oxide.

Then, metal oxide (tantalum oxide) of the second resistance variable layer 212 which is lower in oxygen content than the first resistance variable layer 211 is deposited into the contact hole 26, while metal oxide (tantalum oxide) of the second resistance variable layer 312 which is lower in oxygen content than the first resistance variable layer 311 is deposited into the contact hole 26. The second resistance variable layers 212 and 312 are deposited by, for example, a so-called reactive sputtering, in which sputtering is carried out using a tantalum target in argon and oxygen gas atmosphere. At this time, the oxygen content is about 65 atm %. The metal is deposited by sputtering until the contact hole 26 is fully filled with the metal. Then, unnecessary tantalum oxide on the interlayer insulating layer is removed by CMP, thereby forming each of the second resistance variable layers 212 and 312 only inside the contact hole 26. In a case where hafnium oxide is used instead of the tantalum oxide, each of the second resistance variable layers 212 and 312 can be deposited by reactive sputtering, in which sputtering is carried out using a hafnium target in argon and oxygen gas atmosphere in the same manner.

Thus far, Embodiments 1 to 7 have been described. These embodiments may be combined to implement a variety of alternations. For example, the nonvolatile semiconductor memory device 100 of Embodiment 1, the nonvolatile semiconductor memory device 400 of Embodiment 4, the nonvolatile semiconductor memory device 500 of Embodiment 5, and the nonvolatile semiconductor memory device 600 of Embodiment 6, may be each configured to include the diode element connected in series with the memory section, like the nonvolatile semiconductor memory device 200 of Embodiment 2. Furthermore, like the nonvolatile semiconductor memory device 300 of Embodiment 3, basic constituent units each consisting of the memory section and the diode element may be stacked together.

INDUSTRIAL APPLICABILITY

A nonvolatile semiconductor memory device of the present invention has a cross-point structure which can achieve a miniaturized configuration and a larger-capacity, and implements a memory structure which is not implemented easily in a conventional manufacturing method. Therefore, the nonvolatile semiconductor memory device of the present invention is useful in fields of various electronic equipment incorporating a nonvolatile memory device.

REFERENCE SIGNS LIST 100, 200, 300a, 300b, 400a, 400b, 500a, 500b, 600a, 600b nonvolatile semiconductor memory device (ReRAM)
1 word line
2 lower electrode
3 resistance variable layer
4 intermediate electrode
5 semiconductor layer
6 upper electrode
7 resistance variable element
8 diode element
9 bit line
11 substrate
12 active element
12a source region
12b drain region
12c gate insulating layer
12d gate electrode
13, 16 semiconductor interlayer insulating layer
14, 17, 25, 40, 51 embedded conductor
15 semiconductor electrode wire
17a, 26 contact hole
18, 70 lower copper wire
18a, 39 wire trench
19, 24, 37, 41, 49, 52, 60, 76 interlayer insulating layer
20, 30, 72, 78, 78a, 78b precious metal electrode layer
21, 31, 73 resistance variable layer
21a, 31a resistance variable thin layer
22, 38, 74 upper copper wire (first upper copper wire)
23, 33, 75 memory section (first memory section)
32 intermediate electrode
32a, 35a metal thin layer
34 semiconductor layer
34a semiconductor thin layer
35 upper electrode
36 diode element (first diode element)
38a copper thin layer
42 second precious metal electrode layer
43 second resistance variable layer
44 second intermediate electrode layer
45 second memory section
46 second semiconductor layer
47 second upper electrode
48 second diode element
50 second upper copper wire
53 third precious metal electrode
54 third resistance variable layer
55 third intermediate electrode
56 third memory section
57 third semiconductor layer
58 third upper electrode
59 third diode element
61 third upper copper wire
71, 77 electrode seed layer
79 top cap layer
211, 311 first resistance variable layer
212, 312 second resistance variable layer.

The invention claimed is:

1. A method of manufacturing a nonvolatile semiconductor memory device comprising:
  a step (A) of forming a plurality of stripe-shaped lower copper wires on a substrate;
  a step (B1') of forming an interlayer insulating layer over the substrate provided with the lower copper wires;
  a step (B2') of forming a plurality of contact holes in the interlayer insulating layer such that the contact holes penetrate the interlayer insulating layer to surfaces of the lower copper wires, respectively;
  a step (B3') of forming precious metal electrode layers comprising precious metal on the lower copper wires in bottom portions of the contact holes inside the contact holes, respectively, by electroless selective growth plating in which a metal layer is deposited only on a surface of each of the lower copper wires comprising electric conductors and is not deposited on a side wall of the interlayer insulating later comprising an insulator;
  a step (C) of filling resistance variable layers into the contact holes such that the resistance variable layers are connected to the precious metal electrode layers inside the contact hole, respectively;
  and a step (D) of forming a plurality of stripe-shaped upper copper wires on the interlayer insulating layer and the resistance variable layers such that the upper copper wires are connected to the resistance variable layers, respectively, and cross the lower copper wires, respectively.

2. The method of manufacturing the nonvolatile semiconductor memory device according to claim 1, wherein each of the precious metal electrode layers comprises platinum.

3. The method of manufacturing the nonvolatile semiconductor memory device according to claim 1, wherein each of the precious metal electrode layers comprises platinum and has a layer thickness of 5 nm to 24 nm.

4. The method of manufacturing the nonvolatile semiconductor memory device according to claim 1, comprising forming electrode seed layers on the lower copper wires, respectively, by selective growth plating, and forming the precious metal electrode layers on the electrode seed layers, respectively.

5. The method of manufacturing the nonvolatile semiconductor memory device according to claim 4, wherein each of the electrode seed layers comprises nickel, nickel-phosphorus alloy, or nickel-boron alloy, and each of the precious metal electrode layers comprises platinum.

6. The method of manufacturing the nonvolatile semiconductor memory device according to claim 4, wherein each of the electrode seed layers comprises a stacked-layer structure of a palladium layer and a nickel layer, a stacked-layer structure of the palladium layer and a nickel-phosphorus alloy layer, or a stacked-layer structure of the palladium layer and a nickel-boron alloy layer, and each of the precious metal electrode layers comprises platinum.

7. The method of manufacturing the nonvolatile semiconductor memory device according to claim 1, further comprising forming diode elements on the resistance variable layers such that the diode elements are connected to the resistance variable layers, respectively.

8. The method of manufacturing the nonvolatile semiconductor memory device according to claim 7, further comprising:
repeating steps from a step of forming the precious metal electrode layers or the interlayer insulating layer on the lower copper wires, to a step of forming the upper copper wires, to further stack memory element layers each including the resistance variable layer and the diode element.

9. The method of manufacturing the nonvolatile semiconductor memory device according to claim 1, wherein each of the precious metal electrode layers comprises palladium.

10. The method of manufacturing the nonvolatile semiconductor memory device according to claim 1, wherein each of the precious metal electrode layers comprises palladium and has a layer thickness of 5 nm to 24 nm.

11. The method of manufacturing the nonvolatile semiconductor memory device according to claim 4, wherein each of the electrode seed layers comprises nickel, nickel-phosphorus alloy, or nickel-boron alloy, and each of the precious metal electrode layers comprises palladium.

12. The method of manufacturing the nonvolatile semiconductor memory device according to claim 1,
wherein the step (C) includes a step of filling first resistance variable layers into the contact holes such that the first resistance variable layers are connected to the precious metal electrode layers, respectively; and a step of forming second resistance variable layers on the first resistance variable layers inside the contact holes, respectively; and
wherein the first resistance variable layers and the second resistance variable layers comprise metal oxide of the same kind, and the first resistance variable layers have a higher oxygen content than the second resistance variable layers.

* * * * *